(12) United States Patent
Choi et al.

(10) Patent No.: US 11,963,290 B2
(45) Date of Patent: Apr. 16, 2024

(54) ELECTRONIC DEVICE INCLUDING ANTENNA

(71) Applicant: Samsung Electronics Co., Ltd., Gyeonggi-do (KR)

(72) Inventors: Jongwoo Choi, Gyeonggi-do (KR); Seunghwa Shin, Gyeonggi-do (KR); Kyungrok Lee, Gyeonggi-do (KR); Woosik Cho, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 130 days.

(21) Appl. No.: 17/855,931

(22) Filed: Jul. 1, 2022

(65) Prior Publication Data
US 2023/0010229 A1    Jan. 12, 2023

Related U.S. Application Data

(63) Continuation of application No. PCT/KR2022/008531, filed on Jun. 16, 2022.

(30) Foreign Application Priority Data

Jul. 8, 2021  (KR) .......................... 10-2021-0089680

(51) Int. Cl.
*H05K 1/02*        (2006.01)

(52) U.S. Cl.
CPC ......... *H05K 1/0237* (2013.01); *H05K 1/0209* (2013.01); *H05K 2201/10098* (2013.01); *H05K 2201/10181* (2013.01)

(58) Field of Classification Search
CPC ............... H05K 1/0237; H05K 1/0209; H05K 2201/10098; H05K 2201/10181
See application file for complete search history.

(56) References Cited

U.S. PATENT DOCUMENTS

| 6,909,589 B2 | 6/2005 | Huff |
| 10,078,017 B2 | 9/2018 | Rofougaran |

(Continued)

FOREIGN PATENT DOCUMENTS

| KR | 20-0298937 Y1 | 12/2002 |
| KR | 10-2012-0072770 A | 7/2012 |
| KR | 10-2019-0101640 A | 9/2019 |

OTHER PUBLICATIONS

International Search Report dated Oct. 7, 2022.

*Primary Examiner* — Hoa C Nguyen
(74) *Attorney, Agent, or Firm* — Cha & Reiter, LLC

(57) ABSTRACT

According to certain embodiments, an electronic device comprises: a housing; an electronic component disposed in the housing, wherein the electronic component generates heat during operation; a support cover disposed on the electronic component; a metal member overlapping with the electronic component while interposing the support cover between the metal member and the electronic component; a switching unit selectively forming or disconnecting an electrical connection path of the support cover and the metal member; and at least one processor configured to select an antenna tuning code, based at least in part on whether the switching unit forms or disconnects the electrical connection path, wherein the switching unit includes: a receiving member electrically connected to the support cover and providing a receiving space; a thermally deforming member received in the receiving space, wherein the thermally deforming member deforms based on a temperature; and an elevating member configured to move upwardly to electrically connect the metal member to the support cover, when the thermally deforming member deforms.

20 Claims, 24 Drawing Sheets

(56) References Cited

U.S. PATENT DOCUMENTS

| | | |
|---|---|---|
| 10,095,972 B2 | 10/2018 | Bhatia et al. |
| 10,628,726 B2 | 4/2020 | Bhatia et al. |
| 11,304,337 B2 | 4/2022 | Lee et al. |
| 2004/0150939 A1 | 8/2004 | Huff |
| 2010/0124024 A1* | 5/2010 | Nishiuma .......... H05K 7/20509 361/705 |
| 2013/0050954 A1* | 2/2013 | Albrecht, III ...... H05K 7/20454 361/720 |
| 2014/0069783 A1 | 3/2014 | Rofougaran |
| 2014/0070911 A1 | 3/2014 | Rofougaran |
| 2014/0070984 A1 | 3/2014 | Rofougaran |
| 2014/0073265 A1 | 3/2014 | Rofougaran |
| 2014/0369006 A1* | 12/2014 | Williams ............. H05K 7/2089 29/832 |
| 2017/0255854 A1 | 9/2017 | Bhatia et al. |
| 2019/0034777 A1 | 1/2019 | Bhatia et al. |
| 2020/0128688 A1* | 4/2020 | Jin .......................... H05K 1/18 |
| 2020/0389999 A1 | 12/2020 | Lee et al. |
| 2021/0072683 A1* | 3/2021 | Yoshida ............. G03G 15/2064 |
| 2022/0253006 A1* | 8/2022 | Doda ................. G03G 15/2053 |

* cited by examiner

ELECTRONIC DEVICE INCLUDING ANTENNA

CROSS REFERENCE TO RELATED APPLICATION(S)

This application is a continuation application, claiming priority under § 365(c), of an International application No. PCT/KR2022/008531, filed on Jun. 16, 2022, which is based on and claims priority under 35 U.S.C. § 119 to Korean Patent Application No. 10-2021-0089680, filed on Jul. 8, 2021, in the Korean Intellectual Property Office, the disclosure of which are incorporated by reference herein their entirety.

BACKGROUND

Technical Field

Embodiments in the disclosure relate to an electronic device including an antenna.

Description of Related Art

With the development of an electronic technology, an information technology, and a telecommunication technology, various functions have been integrated in one electronic device. For example, an electronic device may be equipped with a communication circuit or processor having a rapid processing speed, an antenna having a smaller size, and stable and higher transmit/receive efficiency, and a sound module (e.g., a microphone or a speaker module) to provide a higher quality sound or a higher image quality.

As the sound module provided in the electronic device has higher performance, power consumption increases as well as the temperature of the electronic device. The performance may deteriorate due to the higher temperature. To alleviate this, a heat dissipation member electrically connects with the sound module. However, as the spacing between an antenna structure in the vicinity of the sound module and the heat dissipation member becomes narrower, there may be electromagnetic mutual interference between the antenna structure and the heat dissipation member.

SUMMARY

According to certain embodiments, an electronic device comprises: a housing; an electronic component disposed in the housing, wherein the electronic component generates heat during operation; a support cover disposed on the electronic component; a metal member overlapping with the electronic component while interposing the support cover between the metal member and the electronic component; a switching unit selectively forming or disconnecting an electrical connection path of the support cover and the metal member; and at least one processor configured to select an antenna tuning code, based at least in part on whether the switching unit forms or disconnects the electrical connection path, wherein the switching unit includes: a receiving member electrically connected to the support cover and providing a receiving space; a thermally deforming member received in the receiving space, wherein the thermally deforming member deforms based on a temperature; and an elevating member configured to move upwardly to electrically connect the metal member to the support cover, when the thermally deforming member deforms.

According to certain embodiments, an electronic device comprises: a housing; a speaker module disposed in the housing; a heat dissipation member disposed on the speaker module; a switching unit interposed between the speaker module and the heat dissipation member, the switching unit comprising a thermally deforming member, the thermally deforming member having a first shape at a first temperature and a second shape at a second temperature higher than the first temperature; a support cover interposed between the switching unit and the speaker module, and selectively connected to the heat dissipation member by the switching unit; and at least one processor configured to sense whether a temperature is the first temperature or the second temperature and to select an antenna tuning code corresponding to the sensed temperature, wherein the switching unit includes: a receiving member electrically connected to the support cover, and having a receiving space to receive the thermally deforming member; and an elevating member configured to be moved upward by the thermally deforming member having the second shape at the second temperature, thereby causing the elevating member electrically connect the heat dissipation member to the support cover.

With regard to description of drawings, the same or similar components will be marked by the same or similar reference signs.

DETAILED DESCRIPTION

Certain embodiments of the disclosure provide an electronic device capable of ensuring both a heat dissipation effect and antenna performance.

According to embodiments of the disclosure, the electronic device may use a thermal deformation member having the shape varied depending on the temperature for heat dissipation while ensuring antenna performance.

According to embodiments of the disclosure, the electronic device ensures the antenna performance in the optimal level as well as heat dissipation.

A variety of other effects directly or indirectly understood through the disclosure may be provided.

Hereinafter, certain embodiments of the disclosure may be described with reference to accompanying drawings. However, those of ordinary skill in the art will understand that the disclosure is not limited to a specific embodiment, and modifications, equivalents, and/or alternatives on the certain embodiments described herein can be variously made without departing from the scope and spirit of the disclosure.

Figure 1:
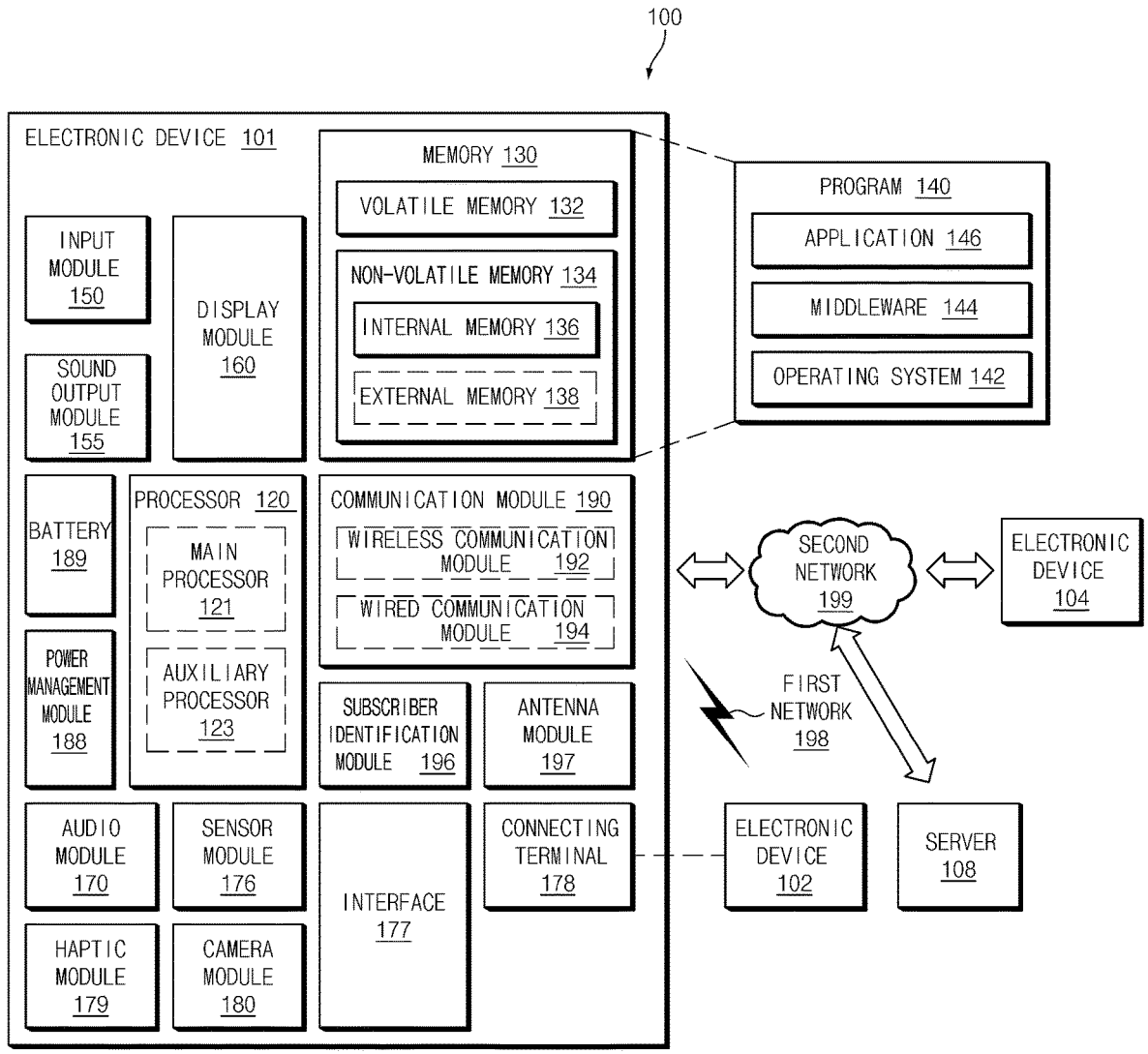
FIG. 1 is a block diagram of an electronic device in a network environment, according to certain embodiments.

FIG. 1 describes an electronic device, which may use an antenna, that may be susceptible to heat dissipation. Miniaturization can allow the electronic device 101 to be carried in a housing, such as the housing described in FIGS. 2A, 2B, and 3. However, the miniaturization causes heat generated from electronic components to potentially interfere with the antenna and other elements.

Figure 6:
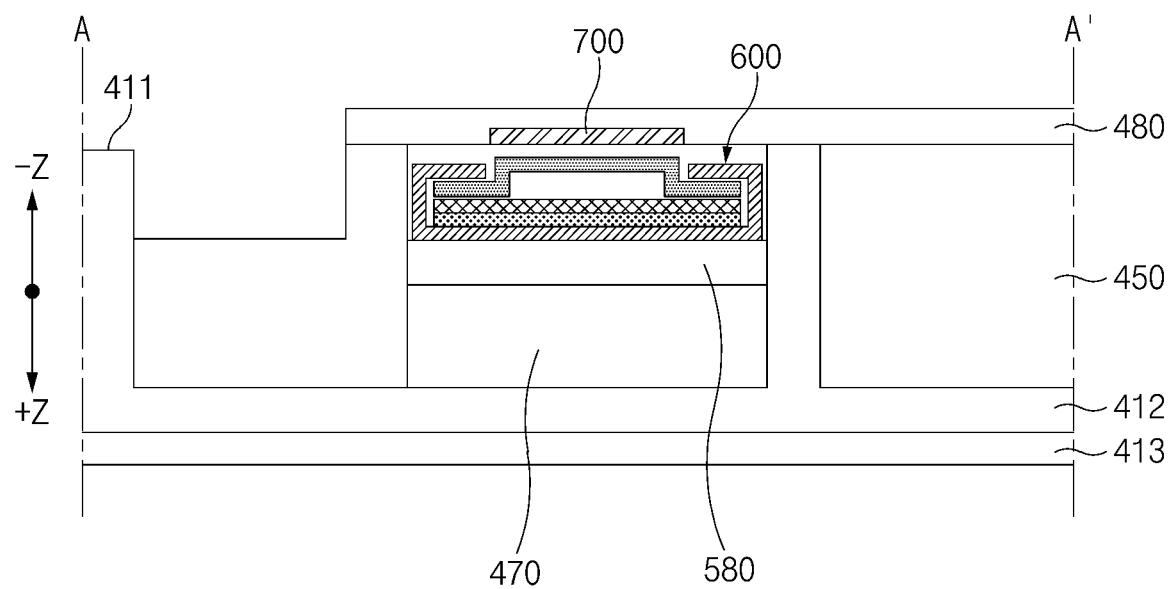
FIG. 6 is a sectional view taken along line A-A' of FIG. 4.

Accordingly, in FIG. 6, an electronic device can include a switching unit 600 that is disposed on an electronic component (e.g., the speaker module 470 or the battery 450) that generates heat during operation. A support cover 580 can be placed between the electronic component and the switching unit 600. A heat dissipation member 480 can be disposed over the switching unit 600.

Figure 7A:
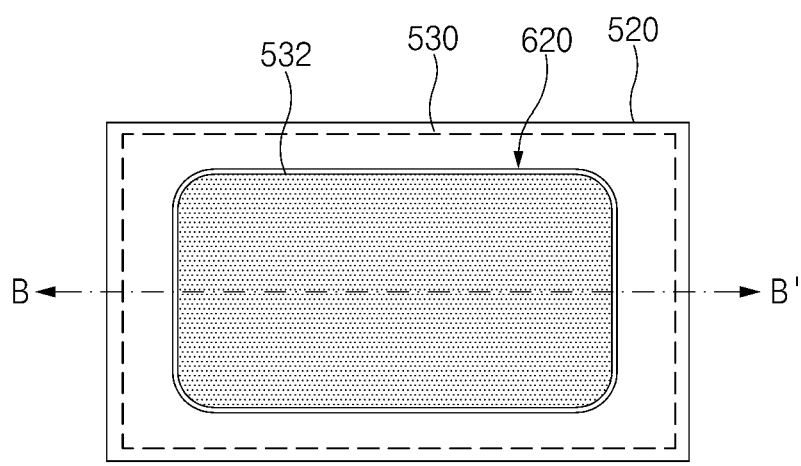
FIGS. 7A and 7B are views illustrating a switching unit included in an electronic device, according to certain embodiments.
Figure 7B:
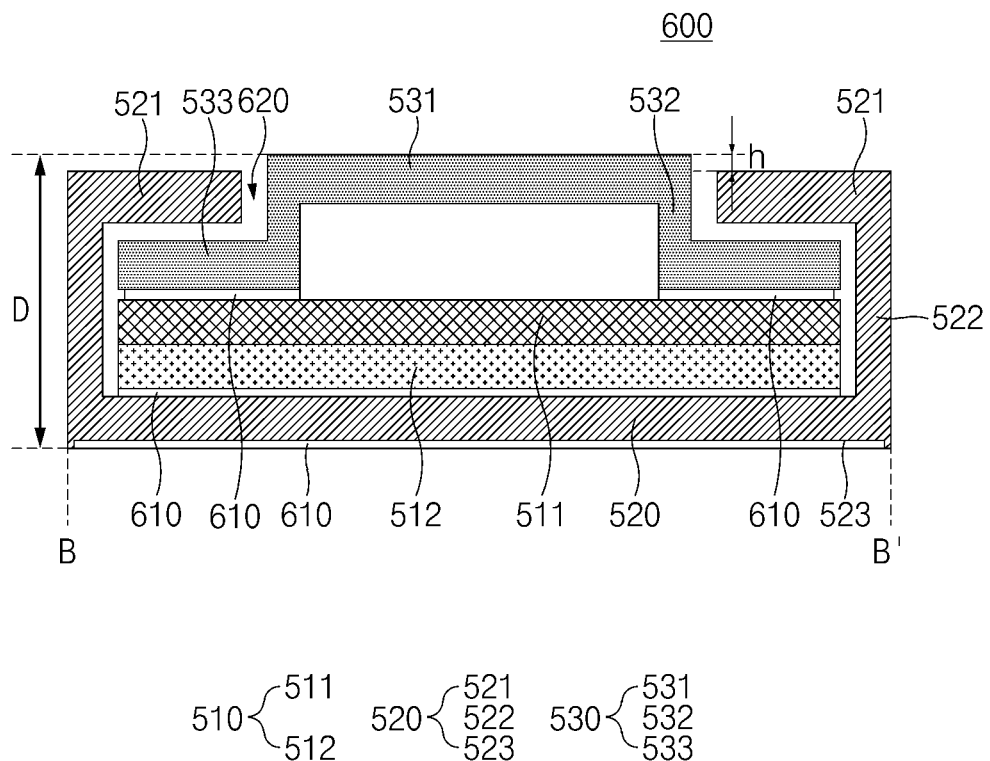
Figure 9A:
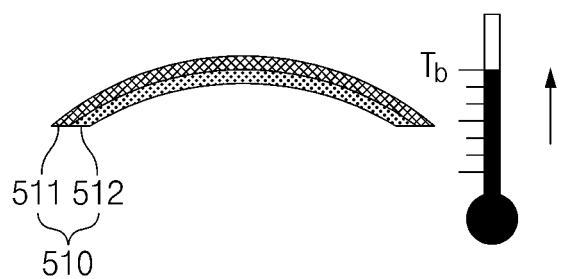
FIGS. 9A and 9B are views illustrating an electronic device when a thermal deformation member is deformed, according to certain embodiments.
Figure 9B:
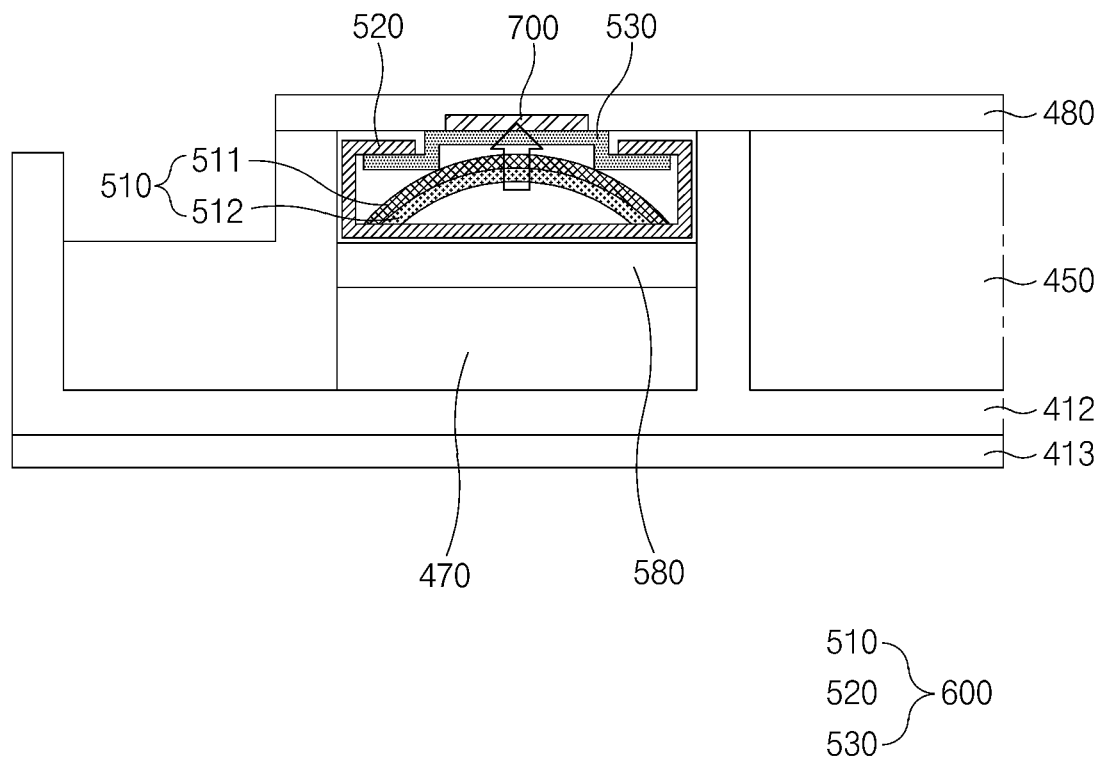

In FIG. 7B, the switching unit 600 can include receiving member 520, a thermally deforming member 510, and an elevating member 530. Turning to FIGS. 9A and 9B, when the electronic component generates sufficient heat, the thermally deforming member 510 deforms, causing the elevating member 530 to make contact with connection pad 700 of the heat dissipation member 480. The foregoing creates an electrical connection path between the support cover 580 and the heat dissipation member 480.

Figure 10A:
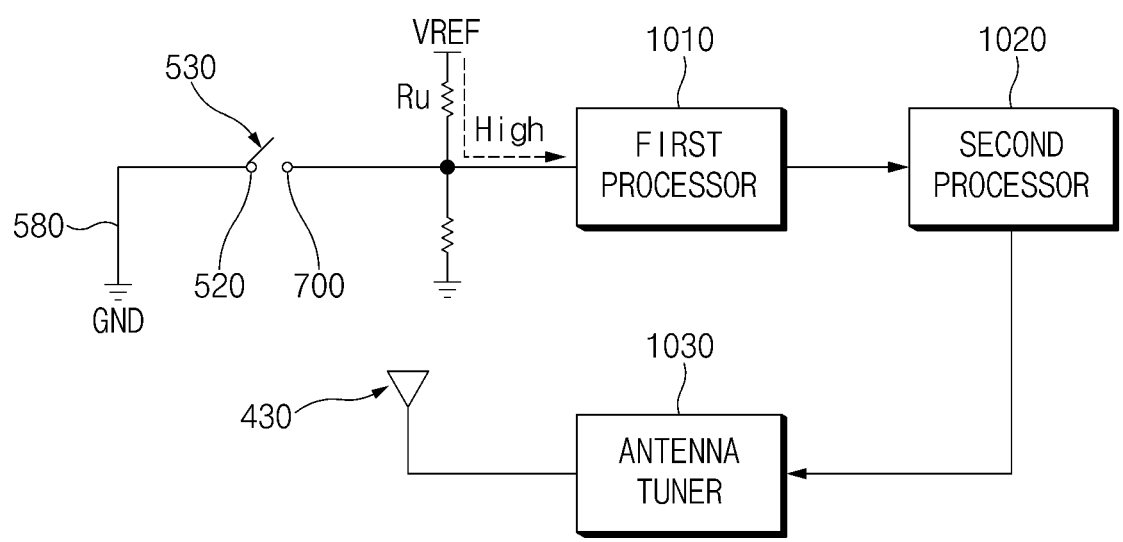
FIGS. 10A and 10B are views illustrating an electronic device including a switching unit and an antenna tuner, according to certain embodiments.
Figure 10B:
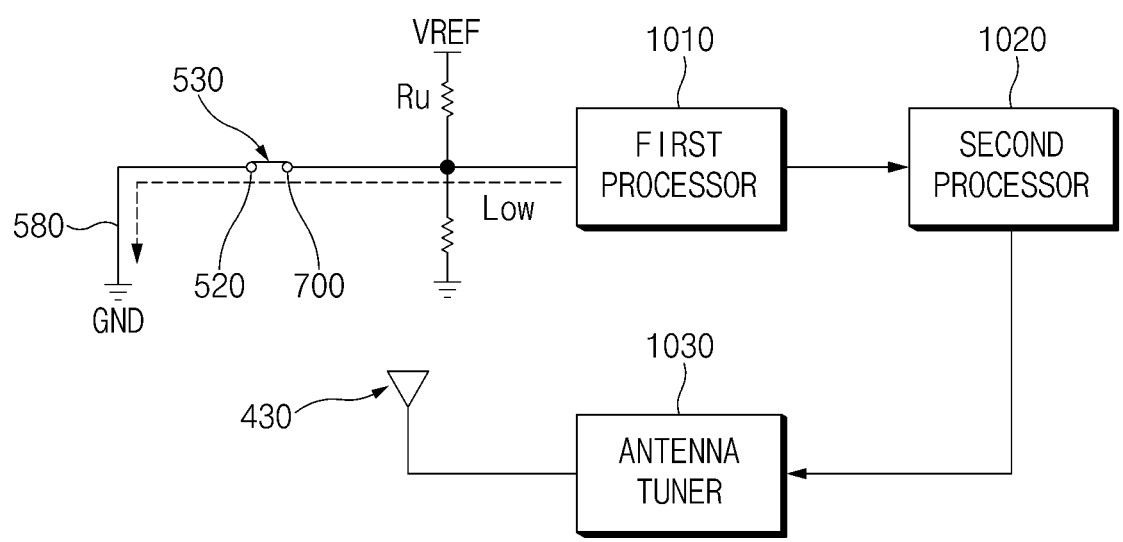

Turning to FIGS. 10A and 10B, the open or shorted connection between the support cover 580 and the connection pad 700 of the heat dissipation member 480 causes the current to flow or drop to first processor 1010. Accordingly, the first processor 1010 can sense a temperature. Based on the sensed temperature, the second processor 1020 sends a tuning code to the antenna tuner 1030.

Electronic Device

FIG. 1 is a block diagram illustrating an electronic device 101 in a network environment 100 according to certain embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™ wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to certain embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example. The electronic device 101 may provide ultra-low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

An electronic device according to certain embodiments disclosed in the disclosure may include devices of various forms. The electronic devices, for example, may include a portable communication device (e.g., a smart phone), a computer device, a portable multimedia device, a portable medical device, a camera, a wearable device, or a home appliance. An electronic device according to certain embodiments of the disclosure is not limited to the above-mentioned devices.

It should be appreciated that certain embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

The term "processor" shall be understood to refer to both the singular and plural contexts in this document.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Certain embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to certain embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to certain embodiments, each component (e.g., a module or a program) of the above-described components may include a single entity or multiple entities. According to certain embodiments, one or more of the above-described components may be omitted, or one or more other components may be added. Alternatively or additionally, a plurality of components (e.g., modules or programs) may be integrated into a single component. In such a case, according to certain embodiments, the integrated component may still perform one or more functions of each of the plurality of components in the same or similar manner as they are performed by a corresponding one of the plurality of components before the integration.

According to certain embodiments, operations performed by the module, the program, or another component may be carried out sequentially, in parallel, repeatedly, or heuristically, or one or more of the operations may be executed in a different order or omitted, or one or more other operations may be added.

During usage of the electronic device 101, the processor 120, and audio module 170 may consume large amount of power. The foregoing causes the processor 120 and audio module 170 to generate heat. The heat can be dissipated by a heat dissipating member.

Miniaturization allows the electronic device 101 to be carried by the user. The electronic device 101 can include a housing which forms the exterior of the electronic device 101 and protects internal components. However, heat dissipation member may be disposed in proximity to the antenna module 197. However, in certain embodiments, electromagnetic interference between the heat dissipation member and the antenna module 197 is reduced or minimized, thereby allowing the communication module 190 to have high performance.

Housing

Figure 2A:
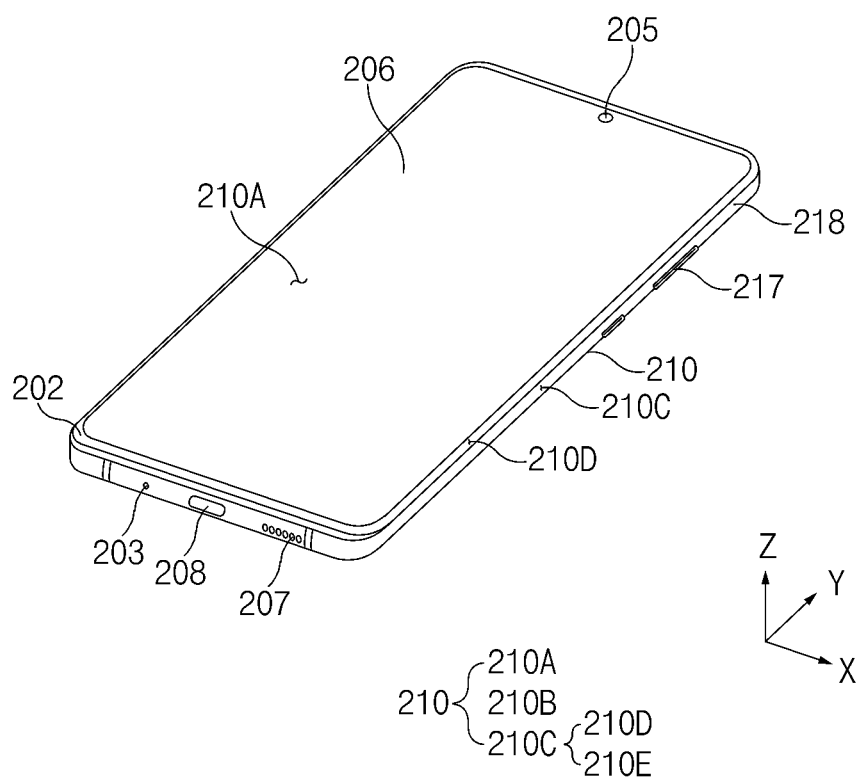
FIG. 2A is a view illustrating a front surface of an electronic device, according to certain embodiments of the disclosure.
Figure 2B:
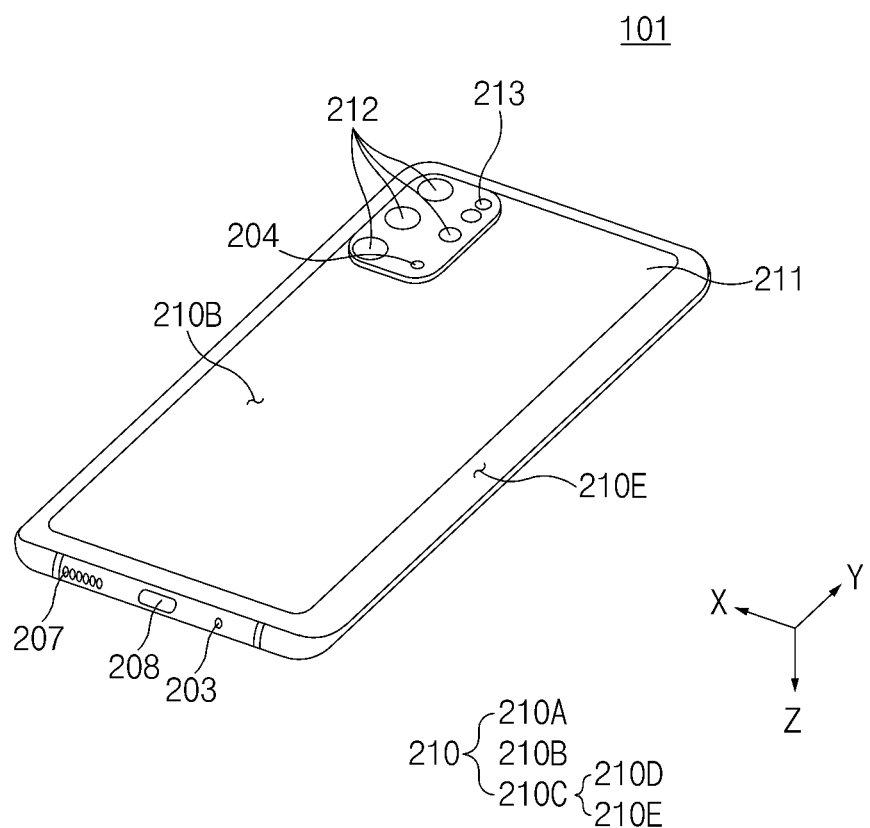
FIG. 2B is a view illustrating a rear surface of the electronic device of FIG. 1, according to certain embodiments of the disclosure.

FIGS. 2A and 2B describe a housing of the electronic device according to certain embodiments.

Referring to FIGS. 2A and 2B, the electronic device 101 may include a housing 210 including a first surface 210A (or front surface), a second surface 210B (or rear surface), and a side surface 210C surrounding the space between the first surface 210A and the second surface 210B.

According to another embodiment (not illustrated), the housing 210 may be referred to as a "structure" that forms a portion of the first surface 210A, the second surface 210B, and the side surface 210C.

According to an embodiment, the first surface 210A may be implemented with a front plate 202 (e.g., a glass plate including various coating layers, or a polymer plate), at least a portion of which is substantially transparent. The second surface 210B may include a back plate 211 substantially opaque. The back plate 211 may include, for example, coated or colored glass, ceramic, polymer, metal (e.g., aluminum, stainless steel (STS), or magnesium) or the combination of the above materials. The side surface 210C may be coupled to the front plate 202 and the back plate 211 and may be implemented with a side bezel structure (or a 'frame structure') 218 including metal and/or polymer.

According to another embodiment, the back plate 211 and the side bezel structure 218 may be integrally formed and may include the same material (e.g., a metal material such as aluminum).

According to the illustrated embodiment, the front plate 202 may include two first regions 210D bent from a partial region of the first surface 210A toward the back plate 211 to seamlessly extend. The first regions 210D may be positioned at opposite ends of a longer edge of the front plate 202.

According to an embodiment illustrated, the back plate 211 may include two second regions 210E bent toward the front plate 202 from a partial region of the second surface 210B. The second regions 210E may include opposite ends of the longer edge of the back plate 211.

According to another embodiment, the front plate 202 (or the back plate 211) may include only one of the first regions 210D (or the second regions 210E). In addition, according to another embodiment, the front plate 202 (or the back plate 211) may not include a part of the first regions 210D (or the second regions 210E).

According to an embodiment of the disclosure, the side bezel structure 218 may have a first thickness (or width) in a lateral direction (e.g., a shorter side) in which the first regions 210D or the second regions 210E are not included when viewed from the side surface of the electronic device 101, and may have a second thickness thinner than the first thickness in a lateral direction (e.g., a longer side) in which the first regions 210D or the second regions 210E are included.

According to an embodiment, the electronic device 101 includes at least one of a display 206 (e.g., the display module 160 of FIG. 1), an audio module 203 or 207 (e.g., the audio module 170 of FIG. 1), a sensor modules (not illustrated) (e.g., the sensor module 176 of FIG. 1), camera modules 205 and 212 (e.g., the camera module 180 of FIG. 1), a key input device 217 (e.g., the input module 150 of FIG. 1), a light emitting device (not illustrated), or a connector hole 208 (e.g., the connection terminal 178 of FIG. 1). According to another embodiment, the electronic device 101 may not include at least one (e.g., the key input devices 217 or the light emitting device (not illustrated)) of the components or may further include any other component.

According to an embodiment, the display 206 may be exposed through most part of the front plate 202. For example, at least a portion of the display 206 may be exposed through the front plate 202 including the first surface 210A and the first regions 210D of the side surface 210C.

According to an embodiment, a corner of the display 206 may be formed to be mostly identical in shape to an outer portion of the front plate 202, which is adjacent thereto. According to another embodiment (not illustrated), to increase the area where the display 206 is exposed, the spacing between an outer portion of the display 206 and an outer portion of the front plate 202 may be formed mostly identically.

According to an embodiment, a surface of the housing 210 (or the front plate 202) may include a screen display region that is formed as the display 206 is visually exposed. For example, the screen display region may include the first surface 210A, and the first regions 210D of the side surface.

According to an embodiment, the screen display regions 210A and 210D may include a sensing region (not illustrated) configured to obtain biometric information of a user. In this case, the wording "the screen display regions 210A and 210D include the sensing region" may be understood as at least a portion of the sensing region may be overlapped with the screen display regions 210A and 210D. For example, the sensing region (not illustrated) may display visual information through the display 206 like the remaining portion of the screen display regions 210A and 210D, and in addition, may mean a region capable of obtaining biometric information (e.g., a fingerprint) of the user.

According to an embodiment, the screen display regions 210A and 210D of the display 206 may include a region in which the first camera module 205 (e.g., a punch hole camera) is visually exposed. For example, at least a portion of a periphery of the region in which the first camera module 205 is exposed may be surrounded by the screen display regions 210A and 210D. According to an embodiment, the first camera module 205 may include a plurality of camera modules (e.g., the camera module 180 of FIG. 1).

According to another embodiment (not illustrated), the display 206 may be combined with or disposed adjacent to a touch sensing circuit, a pressure sensor to measure the intensity (or pressure) of a touch, and/or a digitizer to detect a magnetic stylus pen.

According to an embodiment, audio modules 203, 204, and 207 may include the microphone holes 203 and 204 and the speaker hole 207.

According to an embodiment, the microphone holes 203 and 204 may include a the microphone hole 203 formed in a partial region of the side surface 210C and the microphone hole 204 formed in a partial region of the second surface 210B. The microphone may be disposed inside the microphone holes 203 and 204 to obtain an external sound. The microphone may include a plurality of microphones to sense a direction of a sound. According to an embodiment, the second microphone hole 204 formed in a partial region of the second surface 210B may be disposed to be adjacent to the camera modules 205 and 212. For example, the second microphone hole 204 may obtain sound when the camera modules 205 and 212 are executed, or may obtain a sound, when another function is executed.

According to an embodiment, the speaker hole 207 may include the external speaker hole 207 and a call receiver hole (not illustrated). The external speaker hole 207 may be formed in a portion of the side surface 210C of the electronic device 101. According to another embodiment, the external speaker hole 207 may be implemented in the form of a single hole with the microphone hole 203. Although not illustrated, a call receiver hole (not illustrated) may be formed in another portion of the side surface 210C. For example, the call receiver hole (not illustrated) may be formed in a part (e.g., the part facing the +Y axis direction), which facing another part (e.g., the part facing the −Y axis direction) of the side surface 210C having the external speaker hole 207, of the side surface 210C.

According to an embodiment, the electronic device 101 may include a speaker communicating with the speaker hole 207. According to another embodiment, the speaker may include a piezo-speaker in which the speaker hole 207 is omitted.

According to an embodiment, the sensor modules (e.g., the sensor module 176 of FIG. 1) may generate electrical signals or data values corresponding to an internal operating state or an external environment state of the electronic device 101. For example, the sensor module may include at least one of a proximity sensor, an HRM sensor, a fingerprint sensor, a gesture sensor, a gyro sensor, a barometric pressure sensor, a magnetic sensor, an acceleration sensor, a grip sensor, a color sensor, an infrared (IR) sensor, a biometric sensor, a temperature sensor, a humidity sensor, or an illumination sensor.

According to an embodiment, the camera modules 205 and 212 may include the first camera module 205 (e.g., a punch hole camera, or an under display camera (UDC)) exposed to the first surface 210A of the electronic device 101, the second camera module 212 exposed to the second surface 210B, and/or a flash 213.

According to an embodiment, the first camera module 205 may be exposed through some of the screen display regions 210A and 210D of the display 206. For example, the first camera module 205 may be exposed, through an opening (not illustrated) that is formed at a portion of the display 206, to a partial region of the screen display regions 210A and 210D.

Accordingly to the embodiment, the second camera module 212 may include a plurality of camera modules (e.g., a dual camera, a triple camera, or a quad camera). However, the second camera module 212 is not limited to including a plurality of camera modules, and may include one camera module.

The first camera module 205 and the second camera module 212 may include one or a plurality of lenses, an image sensor, and/or an image signal processor. The flash 213 may include, for example, a light emitting diode or a xenon lamp. According to another embodiment, two or more lenses (e.g., infrared camera, wide-angle, and telephoto lenses) and image sensors may be disposed on one surface of the electronic device 101.

According to an embodiment, the key input device 217 may be disposed on the side surface 210C (e.g., the first regions 210D and/or the second regions 210E) of the housing 210. According to another embodiment, the electronic device 101 may not include some or the entire portion of the key input device 217, and the key input device 217 not included may be implemented in another form, such as a soft key, on the display 206. According to another embodiment, a key input device may include a sensor module (e.g., the sensor) forming the sensing region (not illustrated) included in the screen display regions 210A and 210D.

According to an embodiment, the connector hole 208 may receive a connector. The connector hole 208 may be disposed on the side surface 210C of the housing 210. For example, the connector hole 208 may be disposed in the side surface 210C to be adjacent to at least a portion of the audio module (e.g., the microphone hole 203 and the speaker hole 207). According to another embodiment, the electronic device 101 may include the first connector hole 208 to receive a connector (e.g., the USB connector) to transmit/receive power and/or data to/from an external device and/or a second connector hole (not illustrated) to receive a connector (e.g., an earphone jack) to transmit/receive an audio signal to/from an external device.

According to an embodiment, the electronic device 101 may include a light emitting device (not illustrated). For example, the light emitting device (not illustrated) may be disposed on the first surface 210A of the housing 210. The light emitting device (not illustrated) may provide the information on the state of the electronic device 101, in the optical form. According to another embodiment, the light emitting device (not illustrated) may provide a light source that operates together with an operation of the first camera module 205. For example, the light emitting device (not illustrated) may include a light emitting diode (LED), an IR LED, and/or a xenon lamp.

Figure 3:
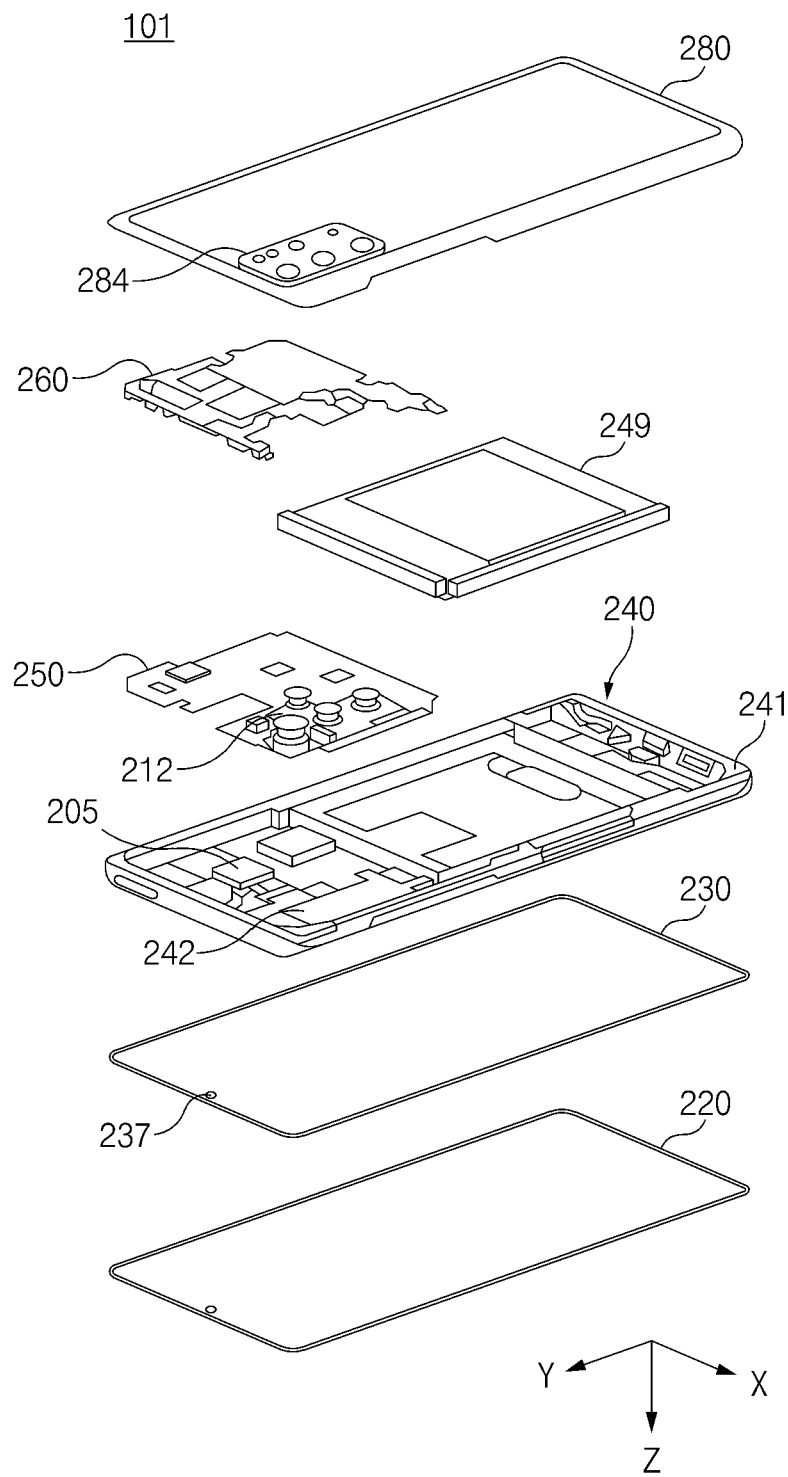
FIG. 3 is an exploded perspective view of an electronic device, according to certain embodiments of the disclosure.

FIG. 3 is an exploded perspective view of an electronic device according to an embodiment.

Referring to FIG. 3, the electronic device 101 may include a front plate 220 (e.g., the front surface 210A and the first region 210D of FIG. 2A), a display 230 (e.g., the display 206 of FIG. 2A), a bracket 240, a battery 249, a printed circuit board 250, a support member 260 (e.g., a rear case), and a rear plate 280 (e.g., the rear surface 210B and the second region 210E of FIG. 2A).

According to another embodiment, the electronic device 101 may not include at least one (e.g., the support member 260) of the components or may further include any other component. At least one of the components of the electronic device 101 may be similar to or the same as at least one of the components of the electronic device 101 of FIG. 2A or 2B. Thus, duplicated description will be omitted to avoid redundancy.

According to an embodiment, at least a portion of the front plate 220, the rear plate 280, and the bracket 240 (e.g., the frame structure 241) may constitute a housing (e.g., the housing 210 of FIGS. 2A and 2B).

According to an embodiment, the bracket 240 may include a frame structure 241 constituting the surface (e.g., a portion of the side surface 210C of FIG. 1) of the electronic device 101, and a plate structure 242 extending inward of the electronic device 101 from the frame structure 241.

The plate structure 242 may be positioned inside the electronic device 101, and may be connected to the frame structure 241 or may be formed integrally with the frame structure 241. For example, the plate structure 242 may be formed of, for example, a metal material and/or a non-metal material (e.g., polymer). The plate structure 242 may have one surface to be coupled to the display 230, and an opposite surface to be coupled to the printed circuit board 250. The printed circuit board 250 may include a processor, a memory, and/or an interface. The processor may include, for example, at least one of a central processing unit, an application processor, a graphic processing device, an image signal processor, a sensor hub processor, or a communication processor.

The memory may include, for example, a volatile memory and/or a non-volatile memory.

The interface may include, for example, a high definition multimedia interface (HDMI), a universal serial bus (USB) interface, an SD card interface, and/or an audio interface. The interface may electrically or physically connect, for example, the electronic device 101 with an external electronic device and may include a USB connector, an SD card/MMC connector, or an audio connector.

According to an embodiment, the battery 249 may supply power to at least one of components of the electronic device 101. According to an embodiment, the battery 249 may include, for example, a primary cell not rechargeable, a secondary cell rechargeable, or a fuel cell. According to an embodiment, at least a part of the battery 249 may be positioned on substantially the same plane as the printed circuit board 250. According to an embodiment, the battery 249 may be disposed inside the electronic device 101 integrally with the electronic device 101, and may be disposed detachably from the electronic device 101.

According to an embodiment, the first camera module 205 may be disposed in the plate structure 242 of the bracket 240, such that a lens is exposed to a partial region of the front plate 220 (e.g., the front surface 210A of FIG. 1) of the electronic device 101.

According to an embodiment, the first camera module 205 may be disposed such that an optical axis of the lens is at least partially aligned with a hole or a recess 237 formed in the display 230. For example, the region to which the lens is exposed may be formed on the front plate 220. For example, at least a portion of the first camera module 205 may include a punch hole camera disposed in a hole or the recess 237 formed in the rear surface of the display 230. For another example, additionally or alternatively, the first camera module 205 may include an under display camera (UDC) disposed in a lower space (e.g., a space from the display 230 toward the inside of the electronic device 101) of the display 230.

According to an embodiment, the second camera module 212 may be disposed on the printed circuit board 250, such that the lens is exposed to a camera region 284 of the rear plate 280 (e.g., the rear surface 210B of FIG. 2B) of the electronic device 101.

According to an embodiment, the camera region 284 may be formed on the surface (e.g., the rear surface 210B of FIG. 2B) of the rear plate 280. According to an embodiment, the camera region 284 may be formed to be at least partially transparent such that external light is incident to the lens of the second camera module 212. According to an embodiment, at least a portion of the camera region 284 may protrude to a specific height from the surface of the rear plate 280. However, the disclosure is not limited thereto. The camera region 284 may form substantially the same plane as the surface of the rear plate 280.

According to certain embodiments of the disclosure, the electronic device may include a bar type electronic device, a foldable type electronic device, a rollable type electronic device, a sliding type electronic device, a wearable type electronic device, a tablet PC, and/or a laptop PC. According to certain embodiments of the disclosure, the electronic device is not limited to the above example, but may include various electronic devices.

Figure 4:
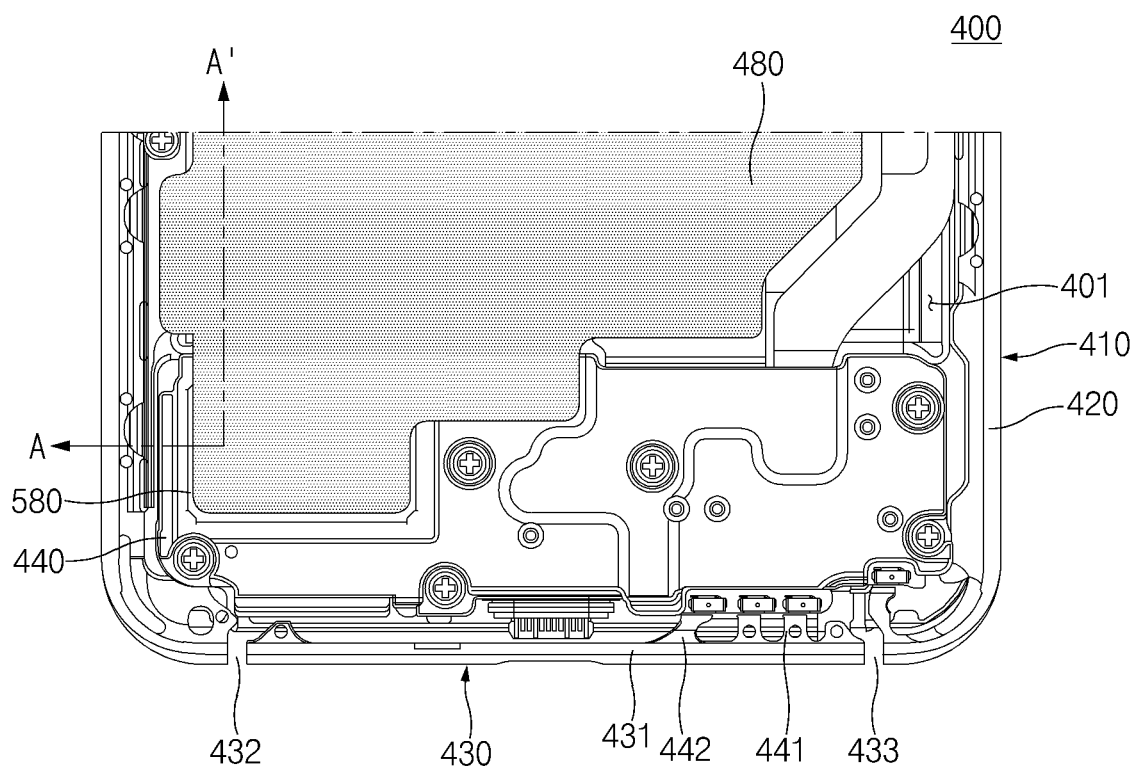
FIG. 4 is a view illustrating the inner configuration of an electronic device without a rear cover, according to certain embodiments.
Figure 5:
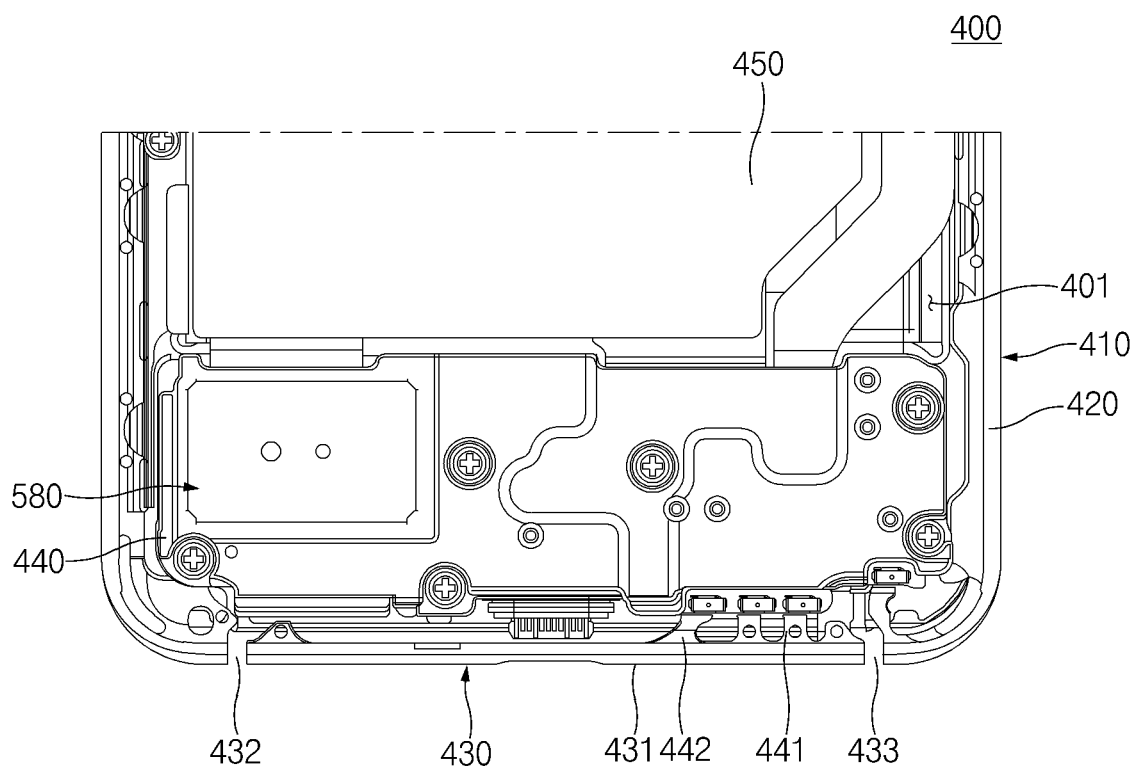
FIG. 5 is a view illustrating the inner configuration of the electronic device of FIG. 4 without the heat dissipation member and the switching unit.

FIG. 4 is a view illustrating the inner configuration of an electronic device under a rear cover, according to certain embodiments, FIG. 5 is a view illustrating the inner configuration of the electronic device of FIG. 4 without a heat dissipation member and a switching unit, and FIG. 6 is a sectional view taken along line A-A' of FIG. 4. The electronic devices of FIGS. 4 to 6 may be at least partially similar to the electronic device 101 of FIG. 1, FIG. 2A, FIG. 2B, or FIG. 3, or may further include another embodiments of the electronic device.

The electronic device 400 includes a support cover 580 disposed on a speaker module 470. A switching unit 600 selectively forms an electrical path between the support cover 580 and a contact pad 700 of a heat dissipation member 480. The switching unit 600 deforms with heat, and when the temperature exceeds a certain temperature, the switching unit 600 forms an electrical path between the support cover 580 and the heat dissipation member 480. A processor (or communication module) can provide an operating code to an antenna, based on the state of the switching unit 600.

Referring to FIGS. 4 to 6, an electronic device 400 may include a housing structure 410. The housing structure 410 may include a front plate (e.g., the front plate 220 of FIG. 3), a rear plate (e.g., the rear plate 280 of FIG. 3) opposite to the front plate, and a side member 420. The side member 420 may surround an inner space 401 between the front plate and the rear plate.

Various electronic parts may be disposed in the inner space 401 of the electronic device 400. The inner space may be defined by one side surface part 411 and a plate part 412 which are included in the side member 420. At least one printed circuit board 440, a speaker module 470, a battery 450, and a heat dissipation member 480 (or a metal member) may be disposed in the inner space 401 of the electronic device 400. A functional member 413 may be disposed on one surface of the plate part 412, which faces a direction (e.g., +Z direction) opposite to the speaker module 470. For example, the functional member 413 may include at least one of an optical sheet, an optical adhesive layer, a guide film, a protective plate, a stack type protective layer, and a protective film.

The printed circuit board 440 may be disposed in a region in which inner electronic parts (at least one camera module, at least one sensor module, or a speaker module) of the electronic device 400 are densely provided. For example, the printed circuit board 440 may be disposed adjacent to a support cover 580 and support the speaker module 470. The battery 450 may be disposed without overlapping with the printed circuit board 440 or the speaker module 470. The heat dissipation member 480 may be disposed to be overlapped with the battery 450 and the speaker module 470. The heat dissipation member 480 may diffuse or distribute heat emitted from the battery 450. The heat dissipation member 480 may diffuse or distribute heat emitted from the speaker module 470. The heat dissipation member 480 may be formed of a material having a higher thermal conductivity. For example, the heat dissipation member 480 may include a layer and/or a heat pipe formed of at least one of copper (Cu), aluminum (Al), stainless (SUS), or graphite.

The electronic device 400 may include at least one antenna structure 430 formed through at least one side surface of the side member 420. The antenna structure 430 may include a conductive region 431 (e.g., an antenna element) electrically isolated through non-conductive regions 432 and 433 spaced apart from each other, on the at least one side surface of the side member 420. The antenna structure 430 may be electrically connected to a wireless communication circuit mounted on the printed circuit board 440. The conductive region 431 of the antenna structure 430 may include a feeding terminal 441 and a grounding terminal 442. The grounding terminal 442 may be electrically connected to a grounding part provided on the printed circuit board 440. The feeding terminal 441 may be electrically connected to the feeding part provided in the printed circuit board 440. The conductive region 431 may receive power through the feeding part of the printed circuit board 440 connected to the feeding terminal 441 to operate as at least a portion of an antenna radiator.

The at least one antenna structure 430 can transmit and receive radio signals. The radio signals can correspond to data that is communicated.

A switching unit 600 may be interposed between the support cover 580 and the heat dissipation member 480. The switching unit 600 may selectively form an electrical connection path between the support cover 580 and the heat dissipation member 480. As the switching unit 600 may be deactivated when the ambient temperature of the switching unit 600 is a first temperature (e.g., room temperature), the switching unit 600 may be spaced apart from a contact pad 700 included in the heat dissipation member 480. The contact pad 700 spaced apart from the switching unit 600 may be open from the support cover 580. As the switching unit 600 is activated when the ambient temperature of the switching unit 600 is a second temperature higher than the first temperature, at least a portion of the switching unit 600 may be elevated toward the contact pad 700. The contact pad 700 and the support cover 580 may be electrically connected to each other through the switching unit 600 which is elevated.

A processor (e.g., the processor 120 of FIG. 1) may sense the ambient temperature of the switching unit 600, depending on the operating state of the switching unit 600, and may select an antenna tuning code corresponding to the detected temperature. For example, when the ambient temperature of the switching unit 600 is the first temperature, the processor may set antenna tuning based on an antenna tuning code (e.g., a default tuning code of FIG. 17). This allows radiation performance optimized at the first temperature. For example, when the ambient temperature of the switching unit 600 is the second temperature, the processor may set antenna tuning based on an antenna tuning code (e.g., a correction tuning code of FIG. 17) to optimize radiation performance optimized at the second temperature. It would be noted that in certain embodiments, the communication module (e.g., the communication module 190 of FIG. 1) may perform the foregoing. Accordingly, the disclosure is not limited to the foregoing.

An electronic component (e.g., the speaker module 470 or the battery 450), disposed around the switching unit 600, may be received in the housing 410. During operation, the electronic component generates heat. The ambient temperature of the switching unit 600 may be determined depending on the heating degree of the electronic component, or the external environment state of the electronic device 400. For example, when the ambient temperature of the switching unit 600 is the second temperature by heat emitted from the speaker module 470, at least a portion of the switching unit 600 may be deformed to be electrically connected to the contact pad 700. For another example, when the ambient temperature of the switching unit 600 is the second temperature due to the external environment of the electronic device 400, at least a portion of the switching unit 600 may be deformed to be electrically connected to the contact pad 700.

FIG. 7A is a plan view illustrating a switching unit included in an electronic device, according to certain embodiments, and FIG. 7B is a cross-sectional view illustrating a switching unit taken along line B-B' in FIG. 7A.

Referring to FIGS. 6, 7A, and 7B, the switching unit 600 according to certain embodiments may include a thermally deforming member 510, a receiving member 520, and an elevating member 530.

The thermally deforming member 510 deforms at higher temperatures. When the thermally deforming member 510 deforms at the higher temperature, the thermally deforming member 510 elongates, causing a center portion to separate from the receiving member 520 (See FIG. 9A). The center portion causes the elevating member 530 to move upwards. Movement of the elevating member 530 causes the elevating member 530 to made contact with a contact pad 700 of the heat dissipation member 480.

The receiving member 520 may provide a receiving space for receiving the elevating member 530 and the thermally deforming member 510. The receiving member 520 may include a plurality of first side surface regions 522, a first rear surface region 523, and a first front surface region 521 to surround the receiving space. An opening region 620 open toward the heat dissipation member 480 may be formed in the first front surface region 521. The opening region 620 may be formed to have a width wider than that of the second front surface region 531 of the elevating member 530. The first front surface region 521 may be disposed to be overlapped with the second rear surface region 533 of the elevating member 530. The first front surface region 521 may make contact with at least a portion of the second rear surface region 533 of the elevating member 530, when the elevating member 530 is elevated. The first front surface region 521 may serve as a stopper to restrict the movement of the elevating member 530.

The elevating member 530 may be received in the receiving member 520 together with the thermally deforming member 510. The elevating member 530 may be disposed on the thermally deforming member 510 to be introduced and withdrawn through the opening region 620 of the receiving member 520. The elevating member 530 may be elevated, depending on whether the thermally deforming member 510 is deformed. When the ambient temperature of the switching unit 600 is increased from the first temperature to the second temperature, as the thermally deforming member 510 may be deformed, the elevating member 530 may be elevated. When the ambient temperature of the switching unit 600 is decreased from the second temperature to the first temperature, as the thermally deforming member 510 may be recovered, the elevating member 530 may move down.

The elevating member 530 may include a second side surface region 532, the second rear surface region 533, and the second front surface region 531. The thermally deforming member 510 may be interposed between the second rear surface region 533 of the elevating member 530 and the first rear surface region 523 of the receiving member 520. The second side surface region 532 of the elevating member 530 may be disposed to be spaced apart from the first front surface region 521 of the receiving member 520 while interposing the opening region 620 between the second side surface region 532 and the first front surface region 521.

When the elevating member 530 is elevated, friction between the second side surface region 532 and the receiving member 520 may be avoided. The second front surface region 531 of the elevating member 530 may be introduced into or withdrawn from the receiving member 520 through the opening region 620 of the receiving member 520. The second front surface region 531 of the elevating member 530 may protrude from the first front surface region 521 of the receiving member 520.

At the first temperature, the protruding height 'h' of the second front surface region 531 of the elevating member 530, which protrudes beyond the first front surface region 521 of the receiving member may be made by the spacing between the first front surface region 521 of the receiving member 520 and the heat dissipation member (e.g., the heat dissipation member 480 of FIG. 6). The second front surface region 531 of the elevating member 530 is formed to have a relatively large surface area, thereby sufficiently ensuring a contact area with the heat dissipation member 480. Heat emitted from the speaker module 470 may be moved to the heat dissipation member 480 through the switching unit 600, due to the contact between the elevating member 530 and the heat dissipation member 480.

The thermally deforming member 510 may include bimetal including a first metal layer 511 and a second metal layer 512. The thermal expansion coefficients of the first metal layer 511 and the second metal layer 512 may be different from each other. For example, the first metal layer 511 may have a thermal expansion coefficient greater than a thermal expansion coefficient of the second metal layer 512. The first metal layer 511 may include iron or an iron-nickel-chromium alloy. The second metal layer 512 may include a metal, such as nickel, chromium, zinc, or copper, having the thermal expansion coefficient less than the thermal expansion coefficient of the first metal layer 511.

The thermally deforming member 510 may curve or deform, when the ambient temperature of the thermally deforming member 510 is equal to or greater than a reference temperature. The first metal layer 511 having the thermal expansion coefficient greater than the thermal expansion coefficient of the second metal layer 512 may be expanded to be in a volume larger than a volume of the second metal layer 512. Even if the thermally deforming member 510 is deformed due to the influence of the temperature, the thermally deforming member 510 may be received in the receiving member 520 such that the thermally deforming member 510 is prevented from deviating from the receiving member 520. This causes the center of the thermally deforming member 510 to curve upwards towards the opening region 620, thereby pushing the elevating member 530 upwards.

The deformation degree of the thermally deforming member 510 may be proportional to the difference in thermal expansion coefficient between the first metal layer 511 and the second metal layer 512. According to certain embodiments, the deformation direction of the thermally deforming member 510 may be varied depending on the arrangement of the first metal layer 511 and the second metal layer 512. For example, the thermally deforming member 510, in which the first metal layer 511 having the higher thermal expansion coefficient is closer to the elevating member 530, rather than the second metal layer 512, may be bent toward the elevating member 530 in the inverse 'U' shape, when the surrounding temperature is increased from the first temperature to the second temperature.

Alternatively, the thermally deforming member 510, in which the second metal layer 512 having the higher thermal expansion coefficient is closer to the elevating member 530, rather than the first metal layer 511, may be bent toward the speaker module 470, in the 'U' shape, when the ambient temperature is increased from the first temperature to the second temperature.

The thermally deforming member 510 may be coupled to at least one of the receiving member 520 and the elevating member 530 using a mechanical member or an adhesive. For example, the second metal layer 512 of the thermally deforming member 510 may be attached to the first rear surface region 523 of the receiving member 520 through an adhesive member 610. The first metal layer 511 of the thermally deforming member 510 may be attached to the second rear surface region 533 of the elevating member 530 through the adhesive member 610. In addition, the first rear surface region 523 of the receiving member 520 may be attached to a speaker support member (e.g., the support cover 580 of FIG. 5) through the adhesive member 610.

The switching unit 600 may be formed in an ultra-slim type such that the volume occupied by the switching unit 600 in the electronic device is minimized. For example, the whole thickness 'D' of the switching unit 600 may be formed to less 1.0 mm. The whole thickness of the switching unit 600 may become the sum of the thickness of each of the receiving member 520, the adhesive member 610, the thermally deforming member 510, and the elevating member 530, the spacing among the above members 510, 520, 530, and 610, and the minimum protruding height 'h' of the second front surface region 531 of the elevating member 530.

The contact area between the heat dissipation member 480 and the elevating member 530, and the contact area between the elevating member 530 and the receiving member 520 may be determined depending on the area of the opening region 620 of the receiving member 520. For example, when the opening region 620 has a wider area, the contact area between the heat dissipation member 480 and the elevating member 530 may be increased, and the contact area between the elevating member 530 and the receiving member 520 may be decreased. When the opening region 620 has a smaller area, the contact area between the heat dissipation member 480 and the elevating member 530 may be decreased, and the contact area between the elevating member 530 and the receiving member 520 may be increased.

Figure 8A:
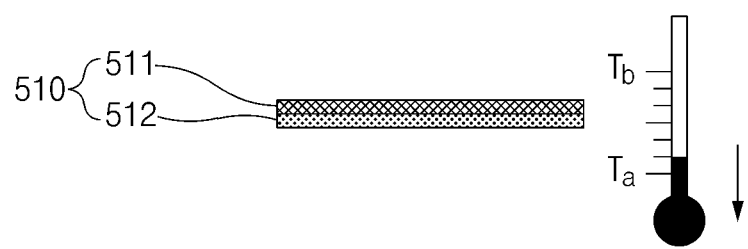
FIGS. 8A and 8B are views illustrating an electronic device when a thermal deformation member is not deformed, according to certain embodiments.
Figure 8B:
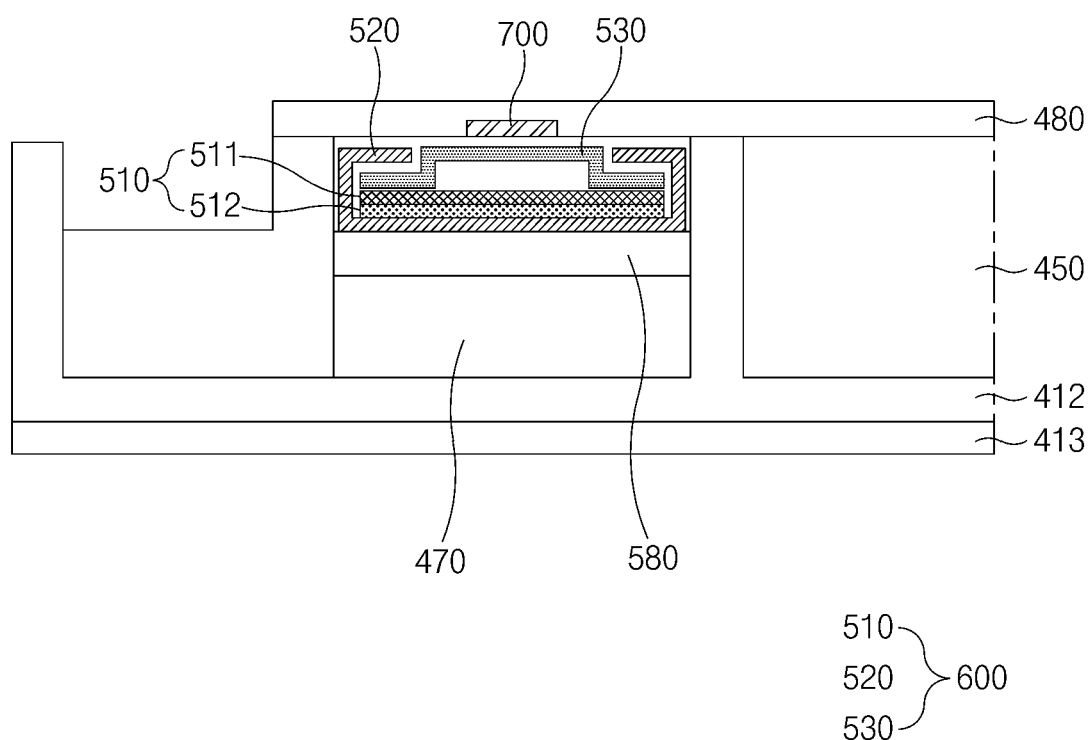

FIGS. 8A and 8B are views illustrating an electronic device when a thermally deforming member is not deformed, according to certain embodiments. In FIG. 8A, the temperature Ta is below temperature Tb. As a result, the first metal layer 511 and second metal layer 512 are relatively flat. In FIG. 8B, the elevating member 830 rests against the relatively flat thermally deforming member 510, and does not make contact with the contact pad 700 of the heat dissipation member 480. Accordingly, switching unit 600 does not form/opens an electrical path between the support cover 580 and the heat dissipation member 480.

Referring to FIGS. 8A and 8B, when an external temperature of the electronic device or the heating temperature of the electronic part is lower, the ambient temperature of the switching unit 600 may be maintained to be the first temperature (e.g., the room temperature) 'Ta'. The thermally deforming member 510 may be maintained to be in an initial form without being deformed at the first temperature (e.g., the room temperature) 'Ta'. Since the thermally deforming member 510 maintains flatness without being deformed at the first temperature 'Ta', the elevating member 530 may be maintained to be spaced apart from the receiving member 520. The elevating member 530 and the receiving member 520 may be maintained to be electrically open. Since the support cover 580 connected to the speaker module 470 is open from the heat dissipation member 480, at least any one of the speaker module 470 and the heat dissipation member 480 may not influence antenna performance of the antenna structure 430.

When the ambient temperature of the thermally deforming member 510 is decreased to the first temperature 'Ta' lower than the second temperature 'Tb' from the second temperature 'Tb', the thermally deforming member 510 may be recovered to be in the initial shape. Since the recovered thermally deforming member 510 maintains flatness, the elevating member 530 may be maintained to be spaced apart from the receiving member 520. The elevating member 530 and the receiving member 520 may be maintained to be electrically open.

FIGS. 9A and 9B are views illustrating an electronic device when a thermally deforming member is deformed, according to certain embodiments. In FIG. 9A, the temperature is Tb. The first metal layer 511 and second metal layer 512 curve upwards. In FIG. 9B, the elevating member 530 presses into the contact pad 700 of the heat dissipation member 480. Accordingly, switching unit 600 does forms an electrical path between the support cover 580 and the heat dissipation member 480.

Referring to FIGS. 9A and 9B, when an external temperature of the electronic device or the temperature of the heat emitted from the electronic part becomes higher, the ambient temperature of the switching unit 600 may be increased to the second temperature 'Tb' from the first temperature 'Ta'. The thermally deforming member 510 may be deformed, as the ambient temperature is increased to the second temperature 'Tb'. When the ambient temperature of the switching unit 600 is increased from the first temperature 'Ta' to 'the second temperature 'Tb', the switching unit 600 may be curved without deviating from the receiving member 520. For example, the first metal layer 511 having the higher thermal expansion coefficient may be curved toward the elevating member 530, when the ambient temperature is increased from the first temperature 'Ta' to the second temperature 'Tb'. The elevating member 530 may be elevated toward the heat dissipation member 480 through the thermally deforming member 510 which is deformed. The elevating member 530, which is elevated, may be electrically short-circuited with the heat dissipation member 480. The heat dissipation member 480 may be electrically short-circuited with the support cover 580 through the elevating member 530 and the receiving member 520. The speaker module 470, the support cover 580, the receiving member 520, the elevating member 530, and the heat dissipation member 480 are electrically connected to each other to form a heat dissipation path. The heat emitted from the speaker module 470 may be dissipated through the heat dissipation member 480.

FIGS. 10A and 10B are views illustrating an electronic device including a switching unit and an antenna tuner, according to certain embodiments. Although FIGS. 10A and 10B illustrate a switching unit including the elevating member 530 and the receiving member 520, the support cover 580, and the contact pad 700 with simple symbols, the switching unit including the elevating member 530 and the receiving member 520, the support cover 580, and the contact pad 700 may be components illustrated in FIGS. 6 and 7. As illustrated in FIG. 10A, when the elevating member 530 is deactivated not to be elevated by a thermally deforming member (e.g., the thermally deforming member 510 of FIG. 8) maintaining flatness, the switching unit 600 including the elevating member 530 and the receiving member 520 may be turned off. As illustrated in FIG. 10B, when the elevating member 530 is activated to be elevated by the thermally deforming member (e.g., the thermally deforming member 510 of FIG. 9) which is deformed, the switching unit 600 including the elevating member 530 and the receiving member 520 may be turned on.

Referring to FIGS. 8, 9, 10A, and 10B, according to certain embodiments, the electronic device may include the switching unit 600, a first processor 1010, a second processor 1020, and an antenna tuner 1030.

The elevating member 530 selectively opens or shorts an electrical path between the support cover 580 and the contact pad 700. When the elevating member 530 opens the electrical path, there is resistance Ru between the first processor 1010 and a power source VREF, causing the first processor 1010 to receive electrical current. However, when the elevating member 530 shorts/establishes the electrical path between the support cover 580 and the contact pad 700, resister Ru is grounded, causing the current to divert to ground and very low current to be received by the first processor 1010. Accordingly, the first processor 1010 can determine whether the heat dissipating member 480 and the support cover 580 are electrically connected.

The first processor 1010 may determine a surrounding environment state of the switching unit 600 based on the input control signal. The second processor 1020 may transmit a tuning code corresponding to the temperature determined through the first processor 1010, to the antenna tuner 1030.

The elevating member 530 and the receiving member 520 of the switching unit 600 may be interposed between the support cover 580 and the contact pad 700. The switching unit 600 may be turned on or turned off depending on the ambient temperature of the switching unit 600. The switching unit 600 including the elevating member 530 and the receiving member 520 may be turned off when the ambient temperature of the switching unit 600 is the first temperature. The contact pad 700 and the support cover 580 may become electrically open through the switching unit 600 which is turned off. The switching unit 600 may be turned on through the elevating member 530 which is elevated, when the ambient temperature of the switching unit 600 is the second temperature. The contact pad 700 and the support cover 580 may become electrically short-circuited through the switching unit 600 which is turned on. According to an embodiment, the switching unit 600 and a pull-up resistor Ru may constitute a control signal generating circuit.

An input terminal of the first processor 1010 may receive a relevant control signal, depending on the operating state of the switching unit 600. For example, as illustrated in FIG. 10A, when the switching unit 600 is turned off, a high-level control signal may be applied to the input terminal of the first processor 1010 from the pull-up resistor Ru connected to a power source VREF. As illustrated in FIG. 10B, when the switching unit 600 is turned on, a current may flow from the pull-up resistor Ru connected to the power source VREF to the ground GND through the elevating member 530 of the switching unit 600, such that a low-level control signal is applied to the input terminal of the first processor 1010.

The first processor 1010 may determine a surrounding environment state of the switching unit 600 based on the input control signal. When the high-level control signal is input, the first processor 1010 may determine that the ambient temperature of the switching unit 600 is the first temperature. When the low-level control signal is input, the first processor 1010 may determine that the ambient temperature of the switching unit 600 is the second temperature. For example, the first processor 1010 may be an application processor which is a main processor (e.g., the main processor 121 of FIG. 1).

The second processor 1020 may transmit a tuning code corresponding to the temperature determined through the first processor 1010, to the antenna tuner 1030. When a control signal corresponding to the first temperature is input through the first processor 1010, the second processor 1020 may select a default tuning code optimized at the first temperature and transmit the selected default tuning code to the antenna tuner 1030. When a control signal corresponding to the second temperature is input through the first processor 1010, the second processor 1020 may select a correction tuning code optimized at the second temperature and transmit the selected correction tuning code to the antenna tuner 1030. For example, the second processor 1020 may be a communication processor which is an auxiliary processor (e.g., the auxiliary processor 123 of FIG. 2).

The antenna tuner 1030 may tune at least one antenna structure 430 included in an electronic device. The antenna tuner 1030 may adjust the operating frequency and/or perform the impedance matching, based on the information on the antenna tuning code received from the second processor 1020. The default tuning code and the correction tuning code included in the antenna tuning code may be information previously stored in the antenna tuner 1030 and be selected by the second processor 1020. The adjustment of the operating frequency and/or the impedance matching may be performed by changing the antenna tuning code corresponding to the antenna structure 430, depending on the temperature. In addition, as impedance changes for each frequency band due to a change in the antenna tuning code, power of a wireless signal radiated from the antenna may be adjusted. When the impedance of the antenna structure 430 is changed by changing the antenna tuning code, the radiation efficiency of the antenna structure 430 may be changed.

The correction tuning code may correct the antenna performance at the second temperature to be similar to the antenna performance at the first temperature. For example, at the second temperature, the correction tuning code applied with a compensation value making the impedance lower than the impedance of the default tuning code may be used. Accordingly, the antenna radiation performance deteriorated due to electrical interference with the heat dissipation member may be corrected to be similar to that of the default tuning code. As described above, the default tuning code is used at the first temperature and the correction tuning code is used at the second temperature, thereby minimizing the difference in antenna performance between the first temperature and the second temperature.

The contact pad 700, the first processor 1010, the second processor 1020, and the antenna tuner 1030 are connected to each other through various communication schemes (e.g., a bus, general purpose input/output (GPIO), a serial peripheral interface (SPI), or a mobile industry processor interface (MIPI) to exchange a signal (e.g., a command or data) together. For example, the contact pad 700 may be connected to the first processor 1010 through a general purpose input/output (GPIO) scheme. The first processor 1010 and the second processor 1020 may be connected to each other through the serial peripheral interface (SPI) scheme or the mobile industry processor interface (MIPI) scheme. The second processor 1020 and the antenna tuner 1030 may be connected to each other through the serial peripheral interface (SPI) scheme or the mobile industry processor interface (MIPI) scheme.

Figure 11:
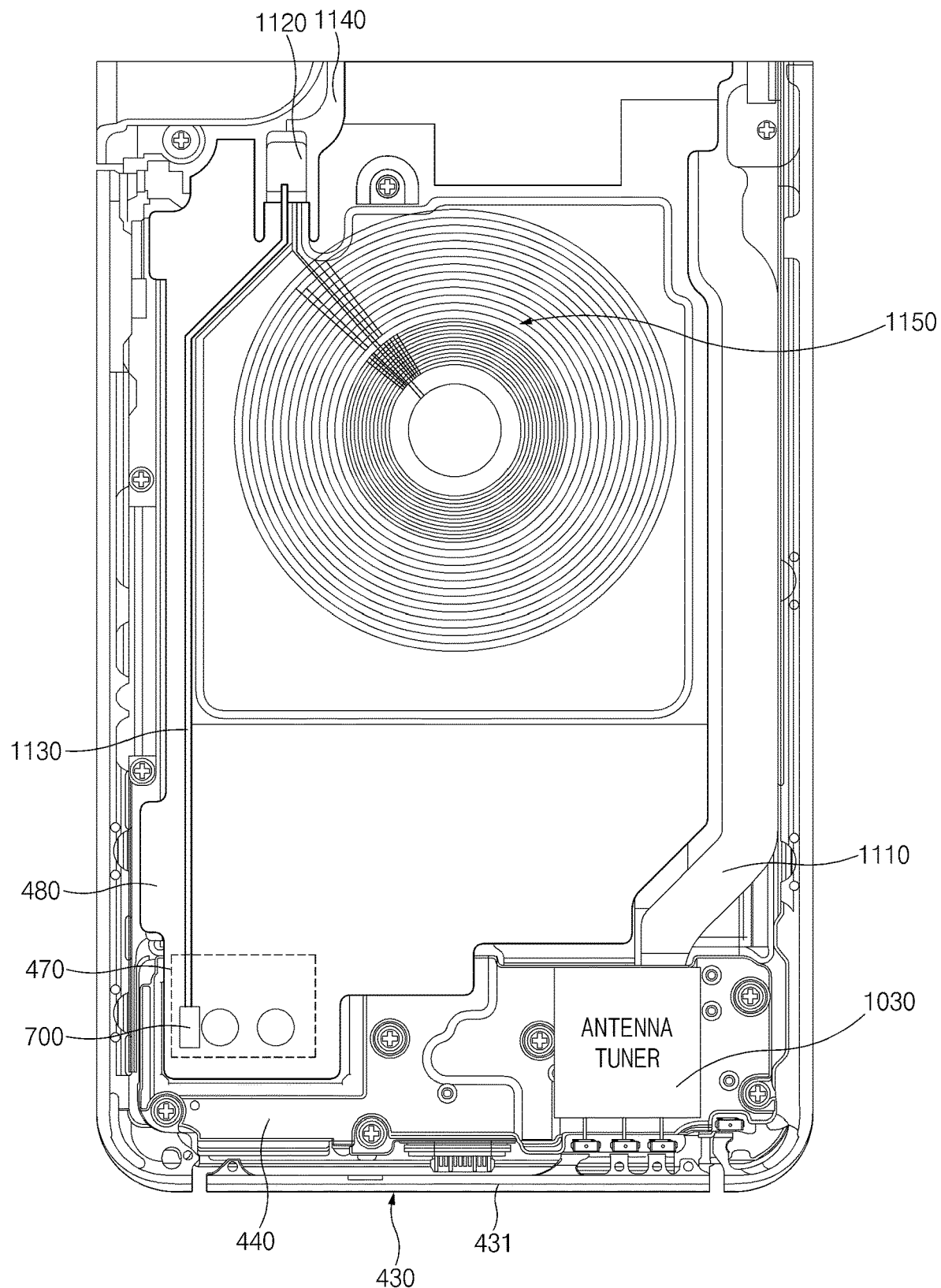
FIG. 11 is a view illustrating an arrangement relationship between a contact pad and an antenna tuner of an electronic device, according to certain embodiments.

FIG. 11 is a view illustrating an arrangement relationship between a contact pad and an antenna tuner of an electronic device, according to certain embodiments.

The electronic device 1100 may includes a planar antenna coil 1150 and antenna 430. The planar antenna coil 1150 may by used for wireless charging or Near Field Communication (NFC).

Referring to FIG. 11, according to certain embodiments, the antenna tuner 1030 of an electronic device 1100 may be disposed on the first printed circuit board 440. The antenna tuner 1030 may be electrically connected to the conductive region 431 of the antenna structure 430 through the first printed circuit board 440.

The contact pad 700 may be connected to a driving chip 1120 through a signal wiring 1130. The contact pad 700 and the signal wiring 1130 may be formed on the heat dissipation member. The driving chip 1120 may be formed on a second printed circuit board 1140 spaced apart from the first printed circuit board 440. At least one of a first processor (the first processor 1010 of FIGS. 10A and 10B), a second processor (e.g., the second processor 1020 of FIGS. 10A and 10B), and the pull-up resistor 'Ru' may be embedded in the driving chip 1120.

The first printed circuit board 440 and the second printed circuit board 1140 may be electrically connected to each other through a flexible circuit board 1110. The second processor formed on the second printed circuit board 1140 may be electrically connected to the antenna tuner 1030 formed on the first printed circuit board 440 through the flexible circuit board 1110.

According to an embodiment, the electronic device 1100 may include a planar antenna coil 1150. The planar antenna coil 1150 may be connected to at least one of a wireless charging module and an NFC module to perform at least one of a wireless charging function and a near-field wireless communication function.

Figure 12:
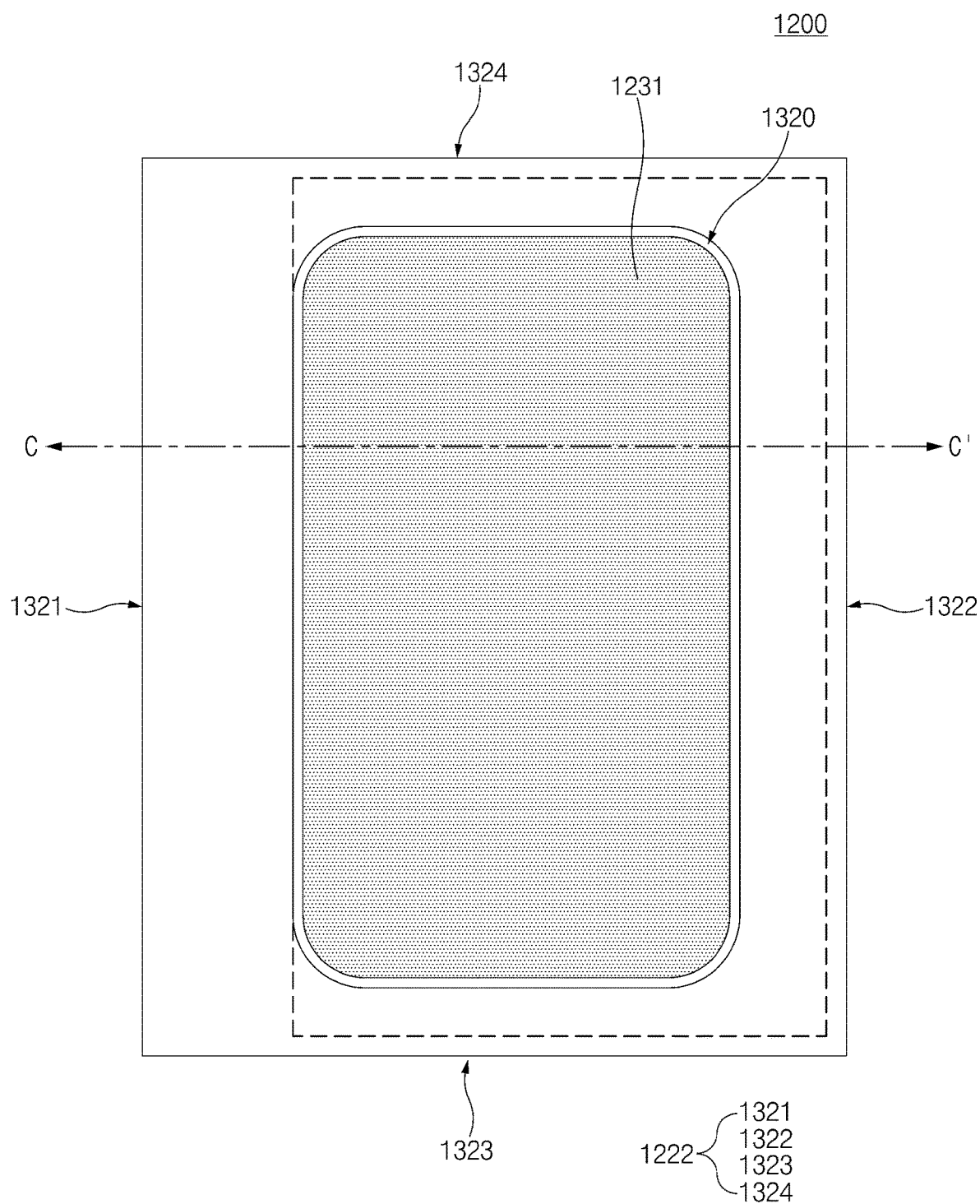
FIG. 12 is a plan view illustrating still another example of a switching unit included in an electronic device, according to certain embodiments.
Figure 13A:
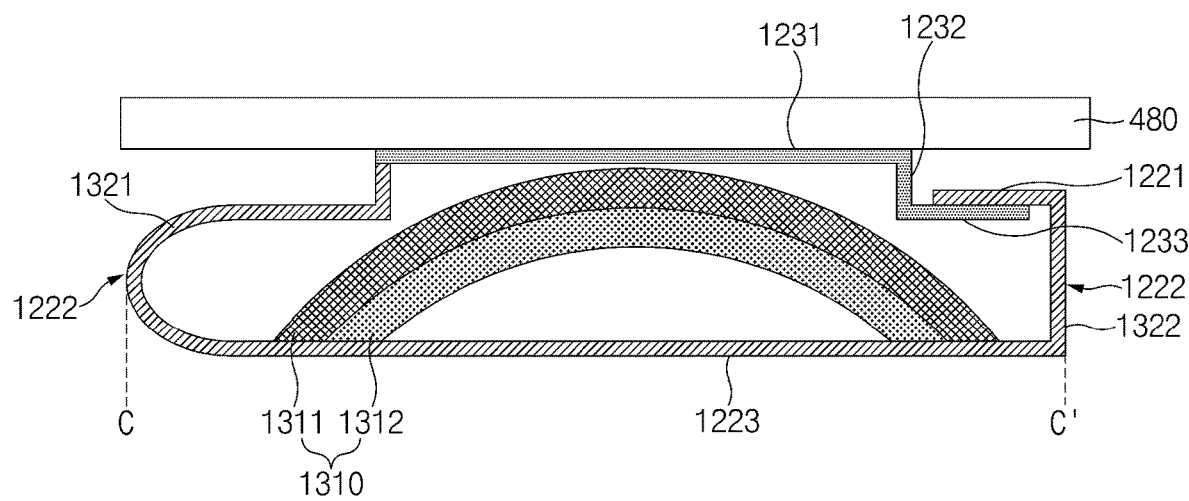
FIGS. 13A and 13B are views illustrating the operation of a switching unit illustrated in FIG. 12.
Figure 13B:
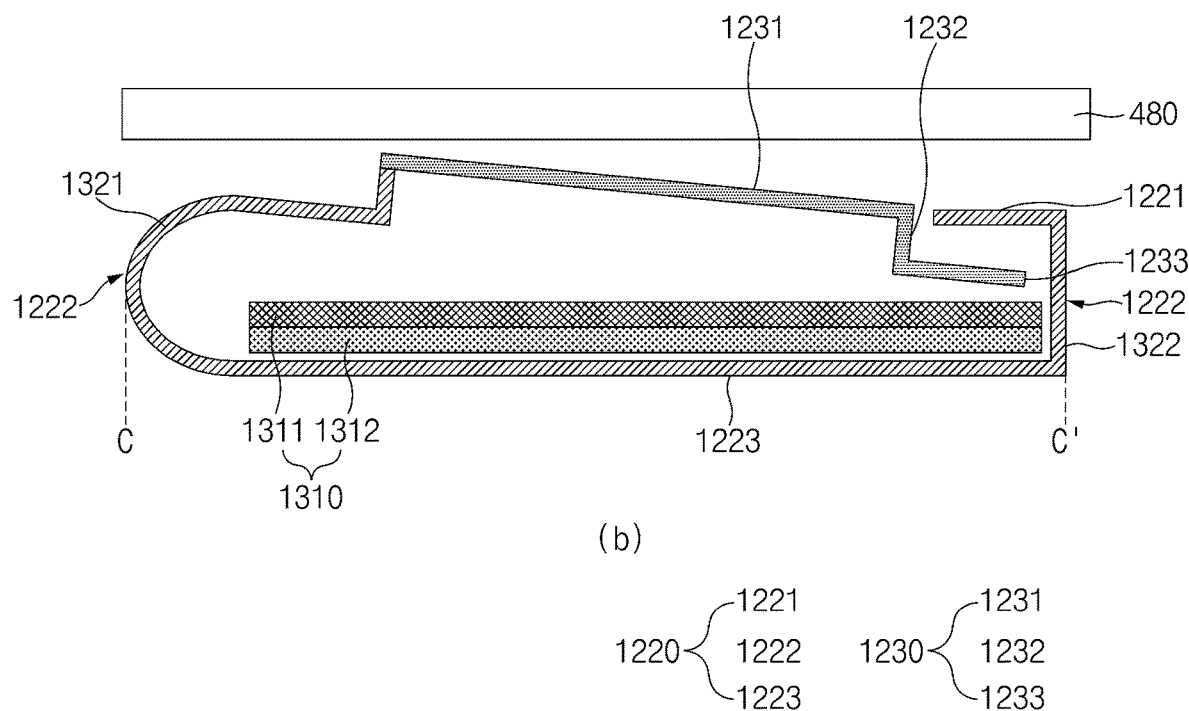

FIG. 12 is a plan view illustrating another example of a switching unit included in an electronic device, according to certain embodiments, and FIGS. 13A and 13B are views illustrating the operation of a switching unit taken along line C-C' of FIG. 12.

Referring to FIGS. 12, 13A and 13B, according to certain embodiments, a switching unit 1200 may include a thermally deforming member 1310, a receiving member 1220, and an elevating member 1230.

The receiving member 1220 may include a first side surface region 1222, a first rear surface region 1223, and a first protruding region 1221 to surround a receiving space and to receive the thermally deforming member 1310. The first side surface region 1222 may include a first sub-side region 1321 and a second sub-side region 1322 facing each other, and a third sub-side region 1323 and a fourth sub-side region 1324 facing each other. The first sub-side region 1321 and the second sub-side region 1322 may have lengths longer than lengths of the third sub-side region 1323 and the fourth sub-side region 1324.

At least a portion of the first sub-side region 1321 may be bent in a C-clip form from the first rear surface region 1223. The first sub-side region 1321 may be connected to a front surface region 1231 of the elevating member 1230. The first sub-side region 1321 may be integrally formed with the front surface region 1231 of the elevating member 1230 to prevent the elevating member 1230 from being separated from the receiving member 1220.

The first protruding region 1221 may protrude from the second sub-side region 1322 toward a second side surface region 1232 of the elevating member. The first protruding region 1221 may make contact with at least a portion of the second protruding region 1233 of the elevating member 1230, when the elevating member 1230 is elevated.

The elevating member 1230 may be coupled to the receiving member 1220 to provide the receiving space of the thermally deforming member 1310. The elevating member 1230 may be elevated, depending on whether the thermally deforming member 510 is deformed. When the ambient temperature of the switching unit 1200 is increased to the second temperature from the first temperature, as the thermally deforming member 1310 may be deformed as illustrated in FIG. 13A, the elevating member 1230 may be elevated. When the ambient temperature of the switching unit 1200 is maintained at the first temperature, the thermally deforming member 1310 may maintain flatness state without being deformed, as illustrated in FIG. 13B. When the ambient temperature of the switching unit 1200 is decreased from the second temperature to the first temperature, as the thermally deforming member 1310 may be recovered, the elevating member 1230 may move down.

According to certain embodiments, the elevating member 1230 may include the second side-surface region 1232, the second protruding region 1233, and the front surface region 1231. At least one of the front surface region 1231 and the second protruding region 1233 of the elevating member 1230 may be formed to maintain a state in which the elevating member 1230 is inclined with respect to the heat dissipation member at the first temperature. At least one of the front surface region 1231 and the second protruding region 1233 of the elevating member 1230 may be disposed to be spaced apart from the heat dissipation member 480 at the first temperature.

At least one of the front surface region 1231 and the second protruding region 1233 of the elevating member 1230 may be disposed parallel to the heat dissipation member 480 at the second temperature. A load of the thermally deforming member 1310 may be applied to the elevating member 1230 during a bending operation of the thermally deforming member 1310 including a first metal layer 1311 and a second metal layer 1312. The front surface region 1231 of the elevating member 1230 may move toward the heat dissipation member 480 while forming a specific trajectory around the first sub-side region 1321. Accordingly, the front surface region 1231 of the elevating member 1230 may be electrically connected to the heat dissipation member 480. The second protruding region 1233 of the elevating member 1230 may be electrically connected to the first protruding region 1221 of the receiving member 1220. Heat emitted from the speaker module 470 may be moved to the heat dissipation member 480 through the switching unit 1200, due to the contact between the elevating member 1230 and the heat dissipation member 480.

According to certain embodiments, at least one processor (e.g., the first processor 1010 and the second processor 1020 of FIGS. 10A and 10B) may sense the ambient temperature of the switching unit 600 and select an antenna tuning code corresponding to the detected temperature, depending on the operating state of the switching unit 1200. An antenna tuner (e.g., the antenna tuner 1030 of FIGS. 10A and 10B) may set antenna tuning depending on the antenna tuning code selected by the processor. For example, when the temperature sensed by the processor is the first temperature, the processor may select an antenna tuning code (e.g., a default tuning code of FIG. 17) for implementing optimized radiation performance at the first temperature, and the antenna tuner may set antenna tuning according to the selected antenna tuning code. When the temperature sensed by the processor is the second temperature, the processor may select an antenna tuning code (e.g., the correction tuning code of FIG. 17) for implementing radiation performance optimized at the second temperature, and the antenna tuner may set the antenna tuning based on the selected antenna tuning code.

Figure 14:
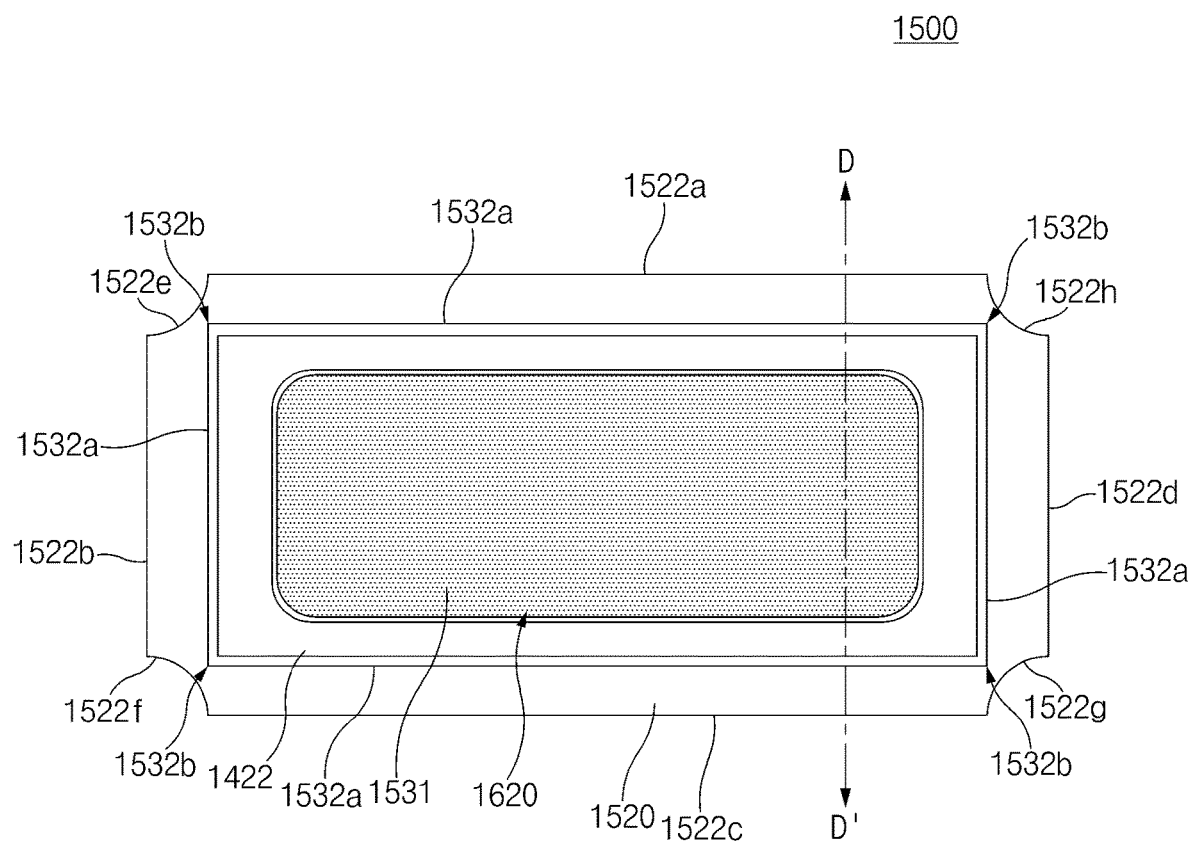
FIG. 14 is a plan view illustrating still another example of a switching unit included in an electronic device, according to certain embodiments.
Figure 15A:
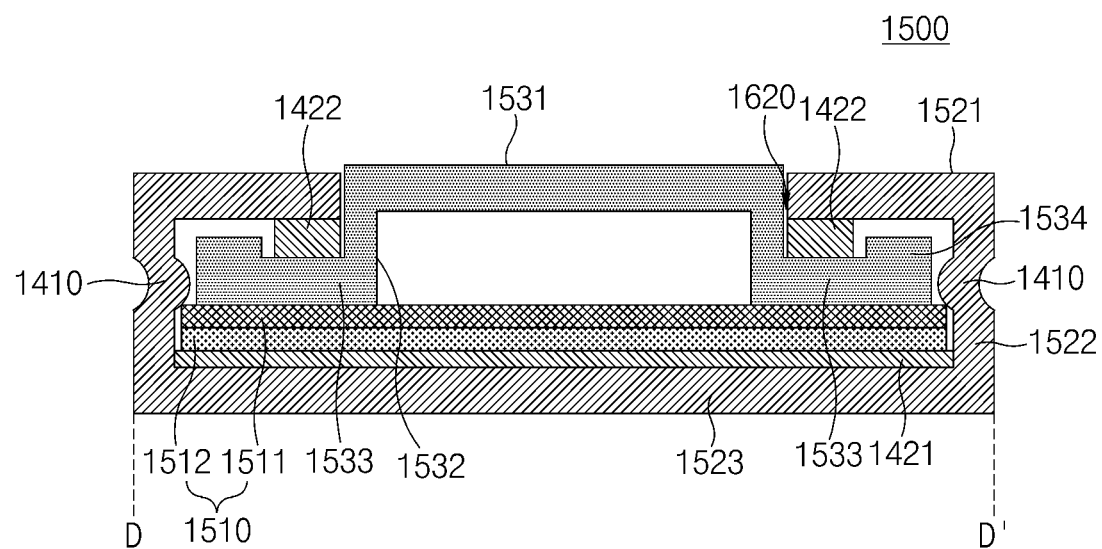
FIGS. 15A and 15B are views illustrating the operation of a switching unit illustrated in FIG. 14.
Figure 15B:
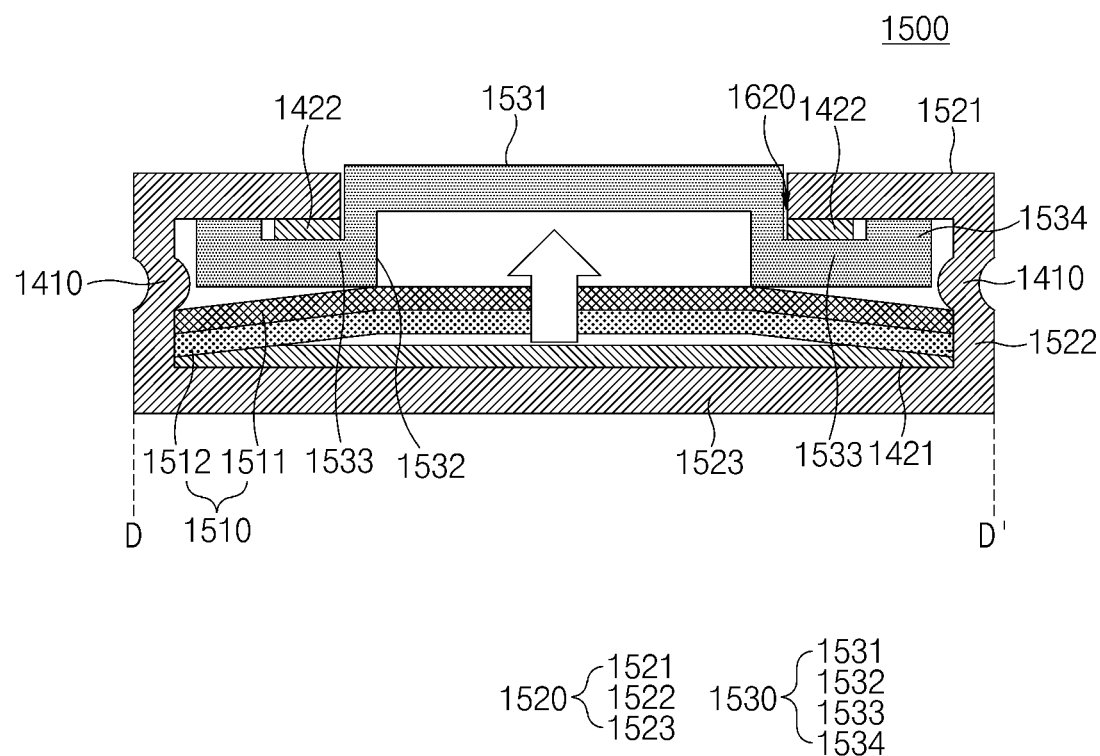

FIG. 14 is a plan view illustrating another example of a switching unit included in an electronic device, according to certain embodiments, and FIGS. 15A and 15B are sectional views illustrating the operation of a switching unit taken along line D-D' of FIG. 14.

Referring to FIGS. 14, 15A and 15B, according to certain embodiments, a switching unit 1500 may include a thermally deforming member 1510, a receiving member 1520, and an elevating member 1530.

The receiving member 1520 may provide a receiving space for receiving the elevating member 1530 and the thermally deforming member 1510. The receiving member 1520 may include a plurality of first side surface regions 1522, a first rear surface region 1523, and a first front surface region 1521 to surround the receiving space. An opening region 1620 may be formed in the first front surface region 1521. The opening region 1620 may be formed to have a width wider than that of a second front surface region 1531 of the elevating member 1530. The first front surface region 1521 may be disposed to be overlapped with a second rear surface region 1533 of the elevating member 1530. The first front surface region 1521 may make contact with at least a portion of the second rear surface region 1533 of the elevating member 1530, when the elevating member 1530 is elevated. The first front surface region 1521 may serve as a stopper to restrict the movement of the elevating member 1530.

Each of a plurality of first side surface regions 1522 may include a fixing protrusion 1410 that is convexly formed toward the receiving space. The fixing protrusion 1410 may protrude toward the elevating member 1530 in a direction substantially perpendicular to the elevating direction of the elevating member 1530. The thermally deforming member 1510 may be disposed between the fixing protrusion 1410 and the first rear surface region 1523. The thermally deforming member 1510 may be fixed into the receiving space of the receiving member 1520, by the fixing protrusion 1410.

At least a portion of the elevating member 1530 may be received in the receiving member 1520 together with the thermally deforming member 1510. The elevating member 1530 may be disposed on the thermally deforming member 1510 to be introduced and withdrawn through the opening region 1620 of the receiving member 1520. The elevating member 1530 may be elevated, depending on whether the thermally deforming member 1510 is deformed. When the ambient temperature of the switching unit 1500 is maintained at the first temperature, the thermally deforming member 510 may maintain flatness without being deformed, as illustrated in FIG. 15A. When the ambient temperature of the switching unit 1500 is decreased from the second temperature to the first temperature, as the thermally deforming member 1510 may be recovered, the elevating member 1530 may move down. When the ambient temperature of the switching unit 1500 is increased to the second temperature from the first temperature, as the thermally deforming member 1510 may be deformed, as illustrated in FIG. 15B, the elevating member 1530 may be elevated.

According to certain embodiments, the elevating member 1530 may include a plurality of second side surface regions 1532, the second rear surface region 1533, the second front surface region 1531, and a protruding region 1534. The thermally deforming member 1510 may be interposed between the second rear surface region 1533 of the elevating member 1530 and the first rear surface region 1523 of the receiving member 1520. The second side surface regions 1532 of the elevating member 1530 may be disposed to be spaced apart from each other while interposing the receiving member 1520 and the opening region 1620 between the second side surface regions 1532. When the elevating member 1530 is elevated, friction between the second side surface region 1532 and the receiving member 1520 may be avoided. The second front surface region 1531 of the elevating member 1530 may be introduced into or withdrawn out of the receiving member 1520 through the opening region 1620 of the receiving member 1520. The second front surface region 1531 of the elevating member 1530 may be electrically connected to the first front surface region 1521 of the receiving member 1520. The second front surface region 1531 of the elevating member 1530 is formed to have a larger surface area, thereby sufficiently ensuring a contact area with the heat dissipation member (e.g., the heat dissipation member 480 of FIG. 6A). Heat emitted from the speaker module may be transferred to the heat dissipation member through a switching unit due to contact between the elevating member 1530 and the heat dissipation member. The protruding region 1534 of the elevating member 1530 may protrude toward the first front surface region 1521 of the receiving member 1520 from the second rear surface region 1533. The protruding region 1534 of the elevating member 1530 may make contact with the first front surface region 1521 of the receiving member 1520 when the elevating member 530 is elevated.

According to certain embodiments, the first side surface region 1522 of the receiving member 1520 may be larger than the second side surface region 1532 of the elevating member 1530 in terms of number of outer surfaces. For example, the first side surface region 1522 of the receiving member 1520 may include eight outer surfaces, and the second side surface region 1532 of the elevating member may include four outer surfaces.

According to certain embodiments, the first side surface region 1522 of the receiving member 1520 may include first to eighth outer surfaces 1522a, 1522b, 1522c, 1522d, 1522e, 1522f, 1522g, and 1522h. The first to fourth outer surfaces 1522a, 1522b, 1522c, and 1522d facing the outer surfaces 1532a of the elevating member 1530 may be formed in parallel with the outer surfaces 1532a of the elevating member 1530. The fifth to eighth outer surfaces 1522e, 1522f, 1522g, and 1522h facing the corners 1532b of the elevating member 1530 interposed between the outer surfaces 1532a of the elevating members 1530 may have an inclined surface or a curved surface having a round shape. For example, the fifth to eighth outer surfaces 1522e, 1522f, 1522g and 1522h, which are curved, may be formed toward the outer portion of the receiving member 1520.

The spacing between each of the fifth to eighth outer surfaces 1522e, 1522f, 1522g, and 1522h having an inclined surface or a curved surface and the edge 1532b of the elevating member 1530 may be shorter the spacing between each of the first to fourth outer surfaces 1522a, 1522b, 1522c, and 1522d and the outer surface 1532a of the elevating member 1530. The fifth to eighth outer surfaces 1522e, 1522f, 1522g, and 1522h of the receiving member 1520 may prevent the elevating member 1530 from being moved left and right while serving as guide ribs for the elevating of the elevating member 1530.

According to certain embodiments, the switching unit 1500 may include at least one elastic member 1421 and 1422. The switching unit 1500 may include at least one of the first elastic member 1421 and the second elastic member 1422. The first elastic member 1421 may be interposed between the thermally deforming member 1510 and the first rear surface region 1523 of the receiving member 1520. The first elastic member 1421 may be formed to have a surface area similar to at least one of the surface area of the thermally deforming member 1510 and the surface area of the first rear surface region 1523. The second elastic member 1422 may be interposed between the second rear surface region 1533 of the elevating member 1530 and the first front surface region 1521 of the receiving member 1520. The second elastic member 1422 may be formed to surround the opening region 1620 along the circumference of the opening region 1620 in a space provided between the second side surface region 1532 and the protruding region 1534. The position of the elevating member 1530 may be fixed inside the receiving member 1520, by a compression ratio and repulsive force of at least one of the first elastic member 1421 and the second elastic member 1422.

According to certain embodiments, the repulsive force of at least one of the first elastic member 1421 and the second elastic member 1422 may be smaller than the expansion force of the thermally deforming member 1510. At least one of the first elastic member 1421 and the second elastic member 1422 may be compressed by the thermally deforming member 1510.

According to certain embodiments, the thermally deforming member 1510 may include bimetal including a first metal layer 1511 and a second metal layer 1512 different from each other in thermal expansion coefficient. For example, the first metal layer 1511 may have a thermal expansion coefficient greater than a thermal expansion coefficient of the second metal layer 1512. The first metal layer 1511 having the thermal expansion coefficient greater than the thermal expansion coefficient of the second metal layer 1512 may be expanded to be in a larger volume than the volume of the second metal layer 1512, when the ambient temperature is increased from the first temperature to the second temperature.

According to certain embodiments, when the heating temperature of the electronic component (e.g., the speaker module or/and the battery) disposed around the switching unit 1500 is lower, the ambient temperature of the switching unit 1500 may be maintained at the first temperature. The thermally deforming member 1510 maintains an initial-stage flatness without being deformed at the first temperature, as illustrated in FIG. 15A. Accordingly, the elevating member 1530 may be maintained to be spaced apart from the receiving member 1520. The elevating member 1530 and the receiving member 1520 may be maintained to be electrically open.

According to certain embodiments, when the temperature of the heat emitted from the electronic parts (e.g., the speaker module or/and the battery) disposed around the switching unit 1500 is increased, the ambient temperature of the switching unit 1500 may be increased from the first temperature to the second temperature. As the ambient temperature is increased to the second temperature, the thermally deforming member 510 may be curved without deviating from the receiving member 520 as illustrated in FIG. 15B. The elevating member 1530 may be elevated in a direction opposite to a direction of the thermally deforming member 510, by the deformed thermally deforming member 510. In this case, the expansion force of the thermally deforming member 1510 is greater than the repulsive force of the second elastic member 1422. Accordingly, the elevating member 1530 may be elevated while compressing the second elastic member 1422. The protruding region 1534 of the elevating member 1530 which is elevated may make surface contact with the first front surface region 1521 of the receiving member 1520. The second front surface region 1531 of the elevating member 1530 may be electrically short-circuited with the heat dissipation member (e.g., the heat dissipation member 480 of FIG. 6). The heat dissipation member 480 may be electrically short-circuited with the support cover (e.g., the support cover 580 of FIG. 6) through the elevating member 1530 and the receiving member 1520. The speaker module (e.g., the speaker module 470 of FIG. 6), the support cover, the receiving member 1520, the elevating member 1530, and the heat dissipation member are electrically connected to each other to form a heat dissipation path. The heat emitted from the speaker module may be radiated through the heat dissipation member.

According to certain embodiments, at least one processor (e.g., the first processor 1010 and the second processor 1020 of FIGS. 10A and 10B) may sense the ambient temperature of the switching unit 600, depending on the operation state of the switching unit 1500 and may select the antenna tuning code corresponding to the sensed temperature. An antenna tuner (e.g., the antenna tuner 1030 of FIGS. 10A and 10B) may set antenna tuning depending on the antenna tuning code selected by the processor. When the temperature sensed by the processor is the first temperature, the processor may select an antenna tuning code (e.g., the default tuning code of FIG. 17) for implementing radiation performance optimized at the first temperature, and the antenna tuner may set the antenna tuning based on the selected antenna tuning code. When the temperature sensed by the processor is the second temperature, the processor may select an antenna tuning code (e.g., the correction tuning code of FIG. 17) for implementing radiation performance optimized at the second temperature, and the antenna tuner may set the antenna tuning based on the selected antenna tuning code.

Figure 16:
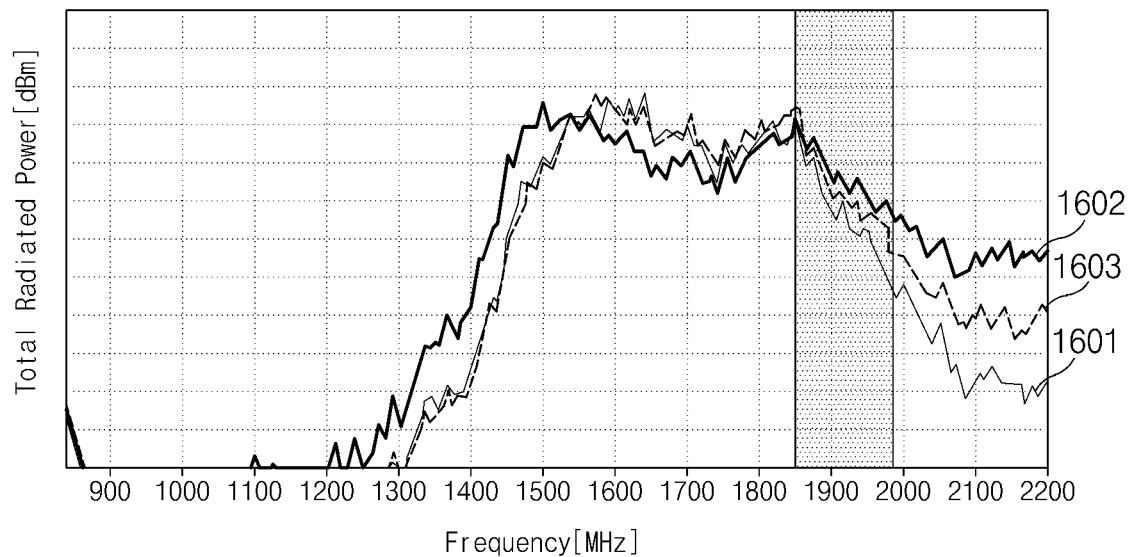
FIG. 16 is a graph illustrating communication performance of an electronic device according to a comparative example, and an electronic device according to certain embodiments.

FIG. 16 is a graph illustrating communication performance of an electronic device according to a comparative example, and an electronic device according to certain embodiments.

Referring to FIG. 16, reference numeral 1601 indicates a graph illustrating communication performance for each frequency according to a comparative example, in which the heat dissipation member (e.g., the heat dissipation member 480 of FIG. 6) is constantly electrically connected to the support cover (e.g., the support cover 580 of FIG. 6), reference numeral 1602 indicates a graph illustrating communication performance for each frequency according to an embodiment in which the heat dissipation member and the support cover operate with default tuning code at the first temperature to be electrically insulated from each other, and reference numeral 1603 indicates a graph illustrating communication performance for each frequency according to an embodiment in which the heat dissipation member and the support cover operate with correction tuning code at a second temperature to be electrically connected to each other. The antenna performance of the electronic device according to an embodiment may be more improved when compared to that of the electronic device according to the comparative example, in a relevant frequency band (e.g., about 1850 MHz to 2000 MHz). For example, the antenna performance (TRP) according to the comparative example is 16 dBm, and 'over the air (OTA)' performance of the electronic device according the comparative example may not be ensured in the relevant frequency band. To the contrary, the antenna performance (TRP) according to an embodiment is 18 dBm at the first temperature, and the antenna performance (TRP) according to an embodiment is 20 dBm at the second temperature. Accordingly, the electronic device according to an embodiment may ensure OTA performance.

In addition, when viewed on the profile of a speaker use time of a user, a use time ratio at the first temperature may be relatively higher than a use time ratio at the second temperature. Accordingly, when the electronic device is used at the second temperature, the user may not feel the degradation in the RF performance lower than that at the first temperature.

Figure 17:
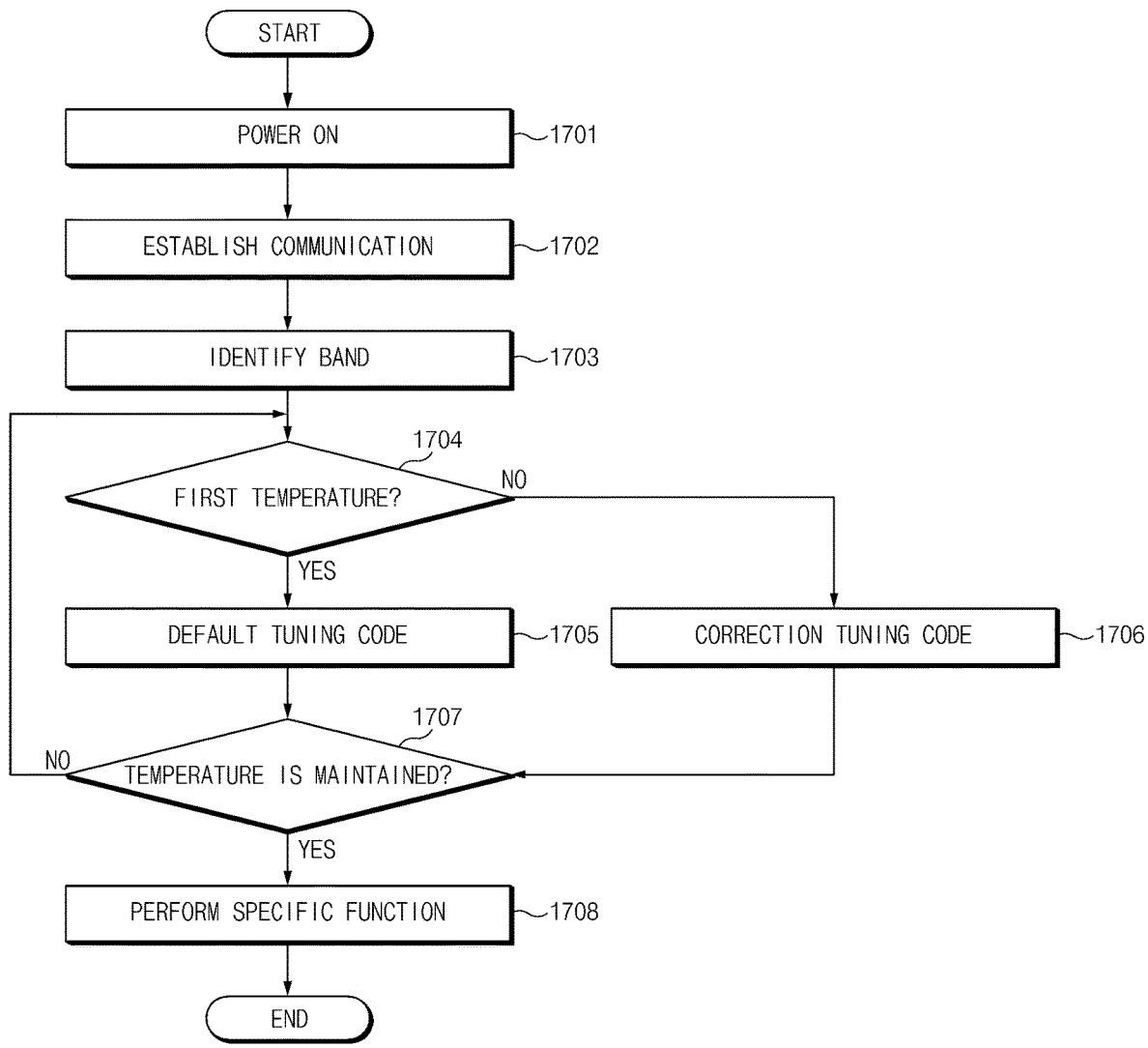
FIG. 17 is a view illustrating an operation flow of an electronic device according to certain embodiments.

FIG. 17 is a view illustrating an operation flow of an electronic device according to certain embodiments. The electronic device of FIG. 17 may be an electronic device including at least one of the above-described switching units.

Referring to FIG. 17, in operation 1701, it may be detected that the power of the electronic device is turned on.

In operation 1702, the communication module (e.g., the communication module of FIG. 1) of the electronic device may determine whether direct (e.g., wired) communication or wireless communication between the electronic device 101 and the external electronic device (e.g., the electronic device 102, the electronic device 104, or the server 108 of FIG. 1) is established.

In operation 1703, communication has been established, and the communication module (e.g., the communication module of FIG. 1) of the electronic device may identify a band currently in communication.

In operation 1704, the first processor (e.g., the first processor 1010 of FIGS. 10A and 10B) may sense the ambient temperature of the switching unit depending on whether the switching unit (e.g., the switching unit 600 of FIG. 7, the switching unit 1200 of FIG. 12, or the switching unit 1500 of FIG. 14) is activated. The first processor may sense whether the ambient temperature of the switching unit is the first temperature or the second temperature higher than the first temperature.

In operation 1705, when the ambient temperature sensed by the first processor is the first temperature, the second processor (e.g., the second processor 1020 of FIGS. 10A and 10B) may select the default tuning code. The antenna tuner (e.g., antenna tuner 1030 of FIGS. 10A and 10B) may adjust an operating frequency of the antenna structure (e.g., antenna structure 430 of FIG. 4) or perform impedance matching, based on the default tuning code selected by the second processor.

In operation 1706, when the ambient temperature sensed by the first processor is the second temperature, the second processor may select the correction tuning code. The antenna tuner may adjust the operating frequency of the antenna structure and/or perform impedance matching, based on the correction tuning code selected by the second processor.

In operation 1707, the first processor may sense the ambient temperature of the switching unit, and determine whether the ambient temperature is changed, depending on whether the switching unit is activated.

In operation 1708, when the ambient temperature sensed by the first processor is maintained, the processor may process performing a designated function. For example, the processor 460 may identify the received event type and perform various functions, such as a call function, a file playback function, or a file editing function, depending on the event type.

According to certain embodiments of the disclosure, an electronic device includes a housing, an electronic component disposed in the housing, wherein the electronic component 470 generates heat during operation, a support cover 580 disposed on the electronic component 470, a metal member 480 overlapping with the electronic component while interposing the support cover between the metal member 480 and the electronic component 470, and a switching unit 600 selectively forming or disconnecting an electrical connection path of the support cover and the metal member, and at least one processor 1010 or 1020 configured to select an antenna tuning code, based at least in part on whether the switching unit forms or disconnects the electrical connection path. The switching unit 600 may include the receiving member 520 electrically connected to the support cover and providing a receiving space, a thermally deforming member 510 received in the receiving space, wherein the thermally deforming member deforms based on a temperature; and the elevating member 530 configured to move upwardly to electrically connect the metal member to the support cover, when the thermally deforming member 510 deforms.

According to certain embodiments, the thermally deforming member 510 includes bimetals 511 and 512, and maintains flatness in a flat shape when the temperature is the first temperature, and may be bent toward the elevating member or the support cover when the thermally deforming member 510 is a second temperature higher than the first temperature.

According to certain embodiments, the support cover and the metal member may be electrically insulated from each when the switching unit 600 disconnects the electrical connection path at the first temperature, and the support cover and the metal member may be electrically connected to each other when the switching unit 600 forms the electrical connection path at the second temperature.

According to certain embodiments, the electronic device may further include a side member 420 forming a portion of the housing, an antenna structure 430 including a conductive region included in at least a portion of the side member, and an antenna tuner 1030 connected to the antenna structure. The at least one processor may include a first processor 1010 to sense the temperature, and a second processor 1020 to select an antenna code corresponding to a temperature sensed by the first processor and to transmit the antenna code to the antenna tuner.

According to certain embodiments, the receiving member 520 may include an opening region 620 open toward the metal member 480, and the elevating member 530 configured to move upward and downward through the opening region 620.

According to certain embodiments, the receiving member 520 may include a first front surface region 521 surrounding the opening region and a first rear surface region 523 spaced apart from the first front surface region. The elevating member 530 may include a second front surface region 531 protruding toward the elevating direction of the elevating member, and a second rear surface region 533 interposed between the first front surface region and the thermally deforming member, and making contact with the first front surface region when the elevating member is elevated.

According to certain embodiments, the electronic device may further include a contact pad 700 disposed inside the metal member and connected to the at least one processor. The second front surface region 531 of the elevating member 530 is configured to be electrically connected to the contact pad 700 when the elevating member is elevated.

According to certain embodiments, the elevating member may further include a protruding region 1534 protruding toward the first front surface region of the receiving member, and the receiving member may further include a fixing protrusion 1410 protruding toward the elevating member in a direction substantially perpendicular to the elevating direction.

According to certain embodiments, the switching unit may further include a first elastic member 1421 interposed between the thermally deforming member and the receiving member; and a second elastic member 1422 disposed between the receiving member and the elevating member to surround the opening region.

According to certain embodiments, the repulsive force between the first elastic member 1421 and the second elastic member 1422 may be greater than the expansion force of the thermally deforming member 1510.

According to certain embodiments, the receiving member may include a plurality of side surface regions in number more than the number of side surfaces of the elevating member, and at least one side surface region 1522e, 1522f, 1522g, or 1522h facing the corner 1532b of the elevating member may have a curved or inclined surface.

According to certain embodiments, the receiving member 1220 and the elevating member 1230 may be integrally formed.

According to certain embodiments, at least one side surface of the receiving member 1220 may be bent in the form of a C-clip.

According to certain embodiments, the elevating member 1230 may be disposed to be inclined with respect to the metal member 480 at the first temperature, and the elevating member 1230 may be disposed in parallel to the metal member 480 at the second temperature to make contact with the metal member.

According to certain embodiments, the electronic device may further include a battery 450 disposed to be adjacent to the electronic component, the electronic component is the speaker module 170, and the metal member 480 may be overlapped with the battery and the speaker module.

According to an embodiment of the disclosure, an electronic device may include a housing, a speaker module 470 disposed in the housing, a heat dissipation member 480 disposed on the speaker module, the switching unit 600 interposed between the speaker module and the heat dissipation member, the switching unit comprising a thermally deforming member, the thermally deforming member having a shape at a first temperature and another shape at a second temperature higher than the first temperature, a support cover 580 interposed between the switching unit and the speaker module, and selectively connected to the heat dissipation member by the switching unit, and at least one processor 1010 and 1020 to sense whether the temperature is the first temperature or the second temperature and to select an antenna tuning code corresponding to the sensed temperature. The switching unit may include a receiving member 520 electrically connected to the support cover and having a receiving space to receive the thermally deforming member, and an elevating member 530 configured to move upwards by the thermally deforming member to electrically connect the heat dissipation member to the support cover.

According to certain embodiments, the thermally deforming member 510 may include bimetals 511 and 512, and the thermally deforming member 510 may maintain flatness in a flat shape when the temperature is the first temperature, and may be bent toward the elevating member or the support cover, when the temperature is the second temperature higher than the first temperature.

According to certain embodiments, the support cover and the heat dissipation member are electrically isolated from each other through the switching unit 600 turned off at the first temperature.

According to certain embodiments, the electronic device may further include a side member 420 included in the housing, an antenna structure 430 including a conductive region included in at least a portion of the side member, and an antenna tuner 1030 connected to the antenna structure. The at least one processor may include a first processor 1010 to sense whether the temperature is the first temperature or the second temperature, and a second processor 1020 to select an antenna code corresponding to the temperature sensed by the first processor and to transmit the antenna code to the antenna tuner.

According to certain embodiments, the antenna tuner 1030 may tune the antenna structure depending on the default tuning code selected by the second processor, and may tune the antenna structure depending on the correction tuning code selected by the second processor.

While the foregoing description has been shown and described with reference to certain embodiments, it will be understood by those skilled in the art that various changes in form and details may be made therein without departing from the spirit and scope of the invention as defined by the appended claims. Accordingly, the scope of the invention is not to be limited by the above embodiments but by the claims and the equivalents thereof.

The invention claimed is:

1. An electronic device comprising:
   a housing;
   an electronic component disposed in the housing, wherein the electronic component generates heat during operation;
   a support cover disposed on the electronic component;
   a metal member overlapping with the electronic component while interposing the support cover between the metal member and the electronic component;
   a switching unit selectively forming or disconnecting an electrical connection path of the support cover and the metal member; and
   at least one processor configured to select an antenna tuning code, based at least in part on whether the switching unit forms or disconnects the electrical connection path,
   wherein the switching unit includes:
   a receiving member electrically connected to the support cover and providing a receiving space;
   a thermally deforming member received in the receiving space, wherein the thermally deforming member deforms based on a temperature; and
   an elevating member configured to move upwardly to electrically connect the metal member to the support cover, when the thermally deforming member deforms.

2. The electronic device of claim 1, wherein the thermally deforming member includes:
   bimetals, and
   wherein the thermally deforming member maintains flatness in a flat shape, when the temperature is a first temperature, and is bent toward the elevating member or the support cover when the thermally deforming member is a second temperature higher than the first temperature.

3. The electronic device of claim 2, wherein the support cover and the metal member are electrically insulated from each other when the switching unit disconnects the electrical connection path at the first temperature, and
   wherein the support cover and the metal member are electrically connected when the switching unit forms an electrical connection path at the second temperature.

4. The electronic device of claim 2, further comprising:
   a side member forming a portion of the housing;
   an antenna structure including a conductive region included in at least a portion of the side member; and
   an antenna tuner connected to the antenna structure, wherein the at least one processor include:
a first processor configured to sense the temperature; and
a second processor configured to select an antenna code corresponding to the temperature sensed by the first processor and to transmit the antenna code to the antenna tuner.

5. The electronic device of claim 2, wherein the receiving member and the elevating member are integrally formed.

6. The electronic device of claim 5, wherein at least one side surface of the receiving member is bent in a C-clip form.

7. The electronic device of claim 6, wherein the elevating member is disposed to be inclined with respect to the metal member at the first temperature, and
wherein the elevating member may be disposed in parallel to the metal member at the second temperature to make contact with the metal member.

8. The electronic device of claim 1, wherein the receiving member includes:
an opening region open toward the metal member, and
wherein the elevating member is configured to move upward and downward through the opening region.

9. The electronic device of claim 8, wherein the receiving member includes:
a first front surface region surrounding the opening region; and
a first rear surface region spaced apart from the first front surface region, and
wherein the elevating member includes:
a second front surface region protruding toward an elevating direction of the elevating member; and
a second rear surface region interposed between the first front surface region and the thermally deforming member, and making contact with the first front surface region when the elevating member is moved upward.

10. The electronic device of claim 9, further comprising:
a contact pad disposed inside the metal member and connected to the at least one processor,
wherein the second front surface region of the elevating member is configured to be electrically connected to the contact pad, when the elevating member is moved upward.

11. The electronic device of claim 9, wherein the elevating member further includes:
a protruding region protruding toward the first front surface region of the receiving member, and
wherein the receiving member further includes:
a fixing protrusion protruding toward the elevating member in a direction substantially perpendicular to the elevating direction.

12. The electronic device of claim 8, wherein the switching unit further includes:
a first elastic member interposed between the thermally deforming member and the receiving member; and
a second elastic member interposed between the receiving member and the elevating member to surround the opening region.

13. The electronic device of claim 12, wherein a repulsive force between the first elastic member and the second elastic member is greater than expansion force of the thermally deforming member.

14. The electronic device of claim 1, wherein the receiving member includes a plurality of side surface regions in number more than a number of side surfaces of the elevating member, and at least one side surface region, which faces a corner of the elevating member, of the plurality of side surface regions has a curved surface or an inclined surface.

15. The electronic device of claim 1, further comprising:
a battery adjacent to the electronic component,
wherein the electronic component comprises a speaker module, and
wherein the metal member overlaps with the battery and the speaker module.

16. An electronic device comprising:
a housing;
a speaker module disposed in the housing;
a heat dissipation member disposed on the speaker module;
a switching unit interposed between the speaker module and the heat dissipation member, the switching unit comprising a thermally deforming member, the thermally deforming member having a first shape at a first temperature and a second shape at a second temperature higher than the first temperature;
a support cover interposed between the switching unit and the speaker module, and selectively connected to the heat dissipation member by the switching unit; and
at least one processor configured to sense whether a temperature is the first temperature or the second temperature and to select an antenna tuning code corresponding to the sensed temperature,
wherein the switching unit includes:
a receiving member electrically connected to the support cover, and having a receiving space to receive the thermally deforming member; and
an elevating member configured to be moved upward by the thermally deforming member having the second shape at the second temperature, thereby causing the elevating member electrically connect the heat dissipation member to the support cover.

17. The electronic device of claim 16, wherein the thermally deforming member includes bimetals, and
wherein the thermally deforming member maintains flatness when the temperature is the first temperature, and is bent toward the elevating member when the temperature is the second temperature higher than the first temperature.

18. The electronic device of claim 16, wherein the support cover and the heat dissipation member are electrically isolated from each other when the thermally deforming member has the first shape at the first temperature.

19. The electronic device of claim 16, further comprising:
a side member included in the housing;
an antenna structure including a conductive region included in at least a portion of the side member; and
an antenna tuner connected to the antenna structure,
wherein the at least one processor includes:
a first processor to sense whether the temperature is the first temperature or the second temperature and
a second processor to select an antenna code corresponding to the temperature sensed by the first processor and to transmit the antenna code to the antenna tuner.

20. The electronic device of claim 19, wherein the antenna tuner tunes the antenna structure depending on a default tuning code selected by the second processor, and tunes the antenna structure depending on a correction tuning code selected by the second processor.

* * * * *